United States Patent
Yoon et al.

(10) Patent No.: US 9,396,786 B2
(45) Date of Patent: Jul. 19, 2016

(54) MEMORY AND MEMORY SYSTEM INCLUDING THE SAME

(71) Applicant: SK hynix Inc., Gyeonggi-do (KR)

(72) Inventors: Seok-Cheol Yoon, Gyeonggi-do (KR); Bo-Yeun Kim, Gyeonggi-do (KR); Jae-Boum Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 98 days.

(21) Appl. No.: 14/506,366

(22) Filed: Oct. 3, 2014

(65) Prior Publication Data

US 2015/0085564 A1    Mar. 26, 2015

Related U.S. Application Data

(63) Continuation-in-part of application No. 14/134,930, filed on Dec. 19, 2013.

(30) Foreign Application Priority Data

Sep. 25, 2013  (KR) .................. 10-2013-0113880

(51) Int. Cl.
    *G11C 11/406* (2006.01)

(52) U.S. Cl.
    CPC .... *G11C 11/40615* (2013.01); *G11C 11/40611* (2013.01); *G11C 2211/4065* (2013.01)

(58) Field of Classification Search
    CPC .................................................. G11C 11/406
    USPC ....................................................... 365/222
    See application file for complete search history.

(56) References Cited

U.S. PATENT DOCUMENTS

| 6,385,127 B1* | 5/2002 | Ikeda | G11C 7/1078 365/189.05 |
| 2003/0151965 A1* | 8/2003 | Jones, Jr. | G11C 7/12 365/222 |

(Continued)

FOREIGN PATENT DOCUMENTS

| KR | 1020120131423 | 12/2012 |
| KR | 1020130136343 | 12/2013 |
| KR | 1020140139849 | 12/2014 |

OTHER PUBLICATIONS

Office Action issued by the USPTO for the parent U.S. Appl. No. 14/134,930 on Apr. 28, 2015.

(Continued)

*Primary Examiner* — Min Huang
(74) *Attorney, Agent, or Firm* — IP & T Group LLP

(57) ABSTRACT

A memory includes a plurality of word lines each coupled to one or more memory cells, an address storage unit suitable for storing an address of a word line selected for access by a control unit among the plurality of word lines at a first time point; and the control unit suitable for sequentially refreshing the plurality of word lines in response to application of a refresh command, refreshing one or more adjacent word lines adjacent to a word line corresponding to the address stored in the address storage unit in response to every Nth application of the refresh command where N is a natural number and selecting one or more of the plurality of word lines for access, wherein the first time point is included in time section other than a refresh section in which the control unit refreshes one or more word lines in response to application of the refresh command.

29 Claims, 13 Drawing Sheets

(56) References Cited

U.S. PATENT DOCUMENTS

| | | | |
|---|---|---|---|
| 2008/0025127 A1 | 1/2008 | Kanda et al. | |
| 2008/0253212 A1* | 10/2008 | Iida | G11C 11/406 365/222 |
| 2009/0310411 A1* | 12/2009 | Lee | G11C 8/12 365/185.11 |
| 2010/0074042 A1* | 3/2010 | Fukuda | G11C 8/04 365/222 |
| 2011/0141836 A1 | 6/2011 | Luthra et al. | |
| 2011/0273935 A1* | 11/2011 | Dong | G11C 11/5642 365/185.22 |
| 2014/0003173 A1* | 1/2014 | Ku | G11C 29/04 365/200 |
| 2014/0095780 A1* | 4/2014 | Bains | G11C 11/406 711/105 |
| 2015/0085563 A1* | 3/2015 | Yoon | G11C 11/40615 365/149 |

OTHER PUBLICATIONS

Office Action issued by the USPTO for the parent U.S. Appl. No. 14/134,930 on Jan. 21, 2016.

Office Action issued by the USPTO for the parent U.S. Appl. No. 14/134,930 on Aug. 25, 2015.

Office Action issued by the USPTO for the parent U.S. Appl. No. 14/134,930 on May 9, 2016.

* cited by examiner

MEMORY AND MEMORY SYSTEM INCLUDING THE SAME

CROSS-REFERENCE TO RELATED APPLICATIONS

This application is a continuation-in-part of U.S. patent application Ser. No. 14/134,930 filed on Dec. 19, 2013, which claims priority of Korean Patent Application No. 10-2013-0113880, filed on Sep. 25, 2013. The disclosure of each of the foregoing application is incorporated herein by reference in its entirety.

TECHNICAL FIELD

This patent document relates to a memory and a memory system including the same.

BACKGROUND

A memory cell of a memory device is formed of a capacitor for storing a charge, which is a data and a transistor for switching the capacitor. The logic level of the data, which is high (logic level 1) or low (logic level 0), depends on accumulation of a charge in the capacitor, meaning that the logic level of the data depends on the voltage of the capacitor.

Since the data is stored in the form of accumulated charges in the capacitor, theoretically there is no consumption of power. However, since the accumulated charges in the capacitor are discharged and thus the amount of the accumulated charges decreases due to current leakage caused by a PN bond of the transistor, the data may be lost without power supply. To prevent the data loss, the capacitor of the memory cell should be recharged repeatedly before the data stored in the capacitor is lost in order to retain the amount of charges. This process of repeatedly recharging the memory cell is referred to as a refresh operation.

The refresh operation is performed in the memory device in response to a refresh command applied from a memory controller. The memory controller applies the refresh command to the memory device repeatedly within a preset period in consideration of a data retention time of the memory device. For example, when the data retention time of the memory device is approximately 64 ms, the entire memory cells in the memory device may be refreshed according to about 8000 times of inputs of the refresh command, the memory controller applies the refresh command to the memory device approximately 8000 times for approximately 64 ms to perform the refresh operation.

As the integration degree of the memory device is increased, the gap between multiple word lines included in the memory device is decreased and the coupling effect between the neighboring word lines is raised. For this reason, when a particular word line of the memory device is frequently activated, compared with the neighboring word lines during the refresh operation, the data of the memory cells coupled with a plurality of word lines adjacent to the particular word line may be damaged. This phenomenon is referred to as word line disturbance.

SUMMARY

Various embodiments according to the present invention having a memory, which may normally operate even when data of memory cells are likely to be degraded due to word line disturbance and a memory system including the same.

In an embodiment, a memory may include a plurality of word lines each coupled to one or more memory cells; an address storage unit suitable for storing an address of a word line selected for access by a control unit among the plurality of word lines at a first time point; and the control unit suitable for sequentially refreshing the plurality of word lines in response to application of a refresh command, refreshing one or more adjacent word lines adjacent to a word line corresponding to the address stored in the address storage unit in response to every Nth application of the refresh command where N is a natural number and selecting one or more of the plurality of word lines for access, wherein the first time point is included in time section other than a refresh section in which the control unit refreshes one or more word lines in response to application of the refresh command.

In an embodiment, a memory may include a plurality of word lines each coupled to one or more memory cells; an address input unit suitable for receiving an address from outside; an address counting unit suitable for performing a counting operation when a refresh command is applied and generating counting address using the counting result; an address storage unit suitable for storing an address of a word line selected for activation by a control unit among the plurality of word lines at a first time point; and the control unit suitable for activating a word line corresponding to the address received by the address input unit in response to application of an active command and refreshing a word line corresponding to the counting address in response to application of the refresh command and one or more adjacent word lines adjacent to a word line corresponding to the address stored in the address storage unit in response to every Nth application of the refresh command where N is a natural number, wherein the first time point is included in time section other than refresh section in which the control unit refreshes one or more word lines in response to application of the refresh command.

In an embodiment, a memory system may include a memory having a plurality of word lines each coupled to one or more memory cells and suitable for sequentially refreshing the plurality of word lines in response to application of a refresh command, selecting one or more of the plurality of word lines for access, storing an address of the selected word line among the plurality of word lines at a first time point, and refreshing one or more adjacent word lines adjacent to a word line corresponding to the stored address in response to every Nth application of the refresh command; and a memory controller suitable for periodically applying the refresh command to the memory, wherein the first time point is included in time section other than refresh section in which one or more word lines are refreshed in response to application of the refresh command.

In an embodiment, a memory may include a plurality of cell arrays each having a plurality of word lines coupled to one or more memory cells; an address storage unit suitable for storing an address of a word line selected for access by each of a plurality of word line control units among the plurality of word lines in each of the cell arrays at a first time point; a refresh control unit suitable for activating a plurality of refresh active signals one or more times in response to application of a refresh command and a target active signal in response to every Nth application of the refresh command where N is a natural number; and the plurality of word line control units each suitable for sequentially refreshing the plurality of word lines of a corresponding cell array in response to application of a corresponding refresh active signal among the plurality of refresh active signals, refreshing one or more adjacent word lines adjacent to a word line corresponding to the address stored in the address storage unit in the corresponding cell array in response to every Nth application of the corresponding refresh active signal among the plurality of refresh active signals when the target active signal is activated, and selecting one or more of the plurality of word lines for access, wherein the time point is included in time section other than refresh section in which the plurality of word line control units refresh one or more word lines in response to application of the refresh command.

In an embodiment, a memory may include a plurality of word lines each coupled to one or more memory cells, an address storage unit suitable for storing an address, and a control unit suitable for sequentially refreshing the plurality of word lines in response to application of a refresh command which is periodically applied, refreshing one or more first adjacent word lines adjacent to a word line corresponding to the address stored in the address storage unit in response to every Nth application of the refresh command, and refreshing one or more second adjacent word lines adjacent to the first adjacent word line in response to every Mth application of the refresh command, where M≥N.

When the plurality of word lines may be sequentially arranged and the word line corresponding to the address stored in the address storage unit is a Kth word line among the plurality of word lines the one or more first adjacent word lines include one or more word lines of a (K−1)th word line and a (K+1)th word line, and the one or more second adjacent word lines include one or more word lines of a (K−2)th word line and a (K+1)th word line.

The memory may further include an address counting unit suitable for performing a counting operation when a refresh command is applied, and generating a counting address using the counting result.

The control unit may include a refresh control unit suitable for activating a refresh active signal one or more times in response to application of the refresh command, activating a first target active signal in response to every Nth application of the refresh command, and activating a second target active signal in response to every Mth application of the refresh command, and a word line control unit suitable for activating a word line corresponding to an input address in response to application of an active command, activating a word line corresponding to the counting address in response to application of the refresh active signal, activating the one or more first adjacent word lines in response to application of the refresh active signal in case where the first target active signal is activated, and activating the one or more second adjacent word lines in response to application of the refresh active signal in case where the second target active signal is activated.

The word line control unit may include an address generator suitable for receiving the address stored in the address storage unit, and generating a target address corresponding to the one or more first adjacent word lines in response to activation of the first target active signal, or generating a target address corresponding to the one or more second adjacent word lines in response to activation of the second target active signal, an address transmitter suitable for transmitting the input address as the address signal when the active command is activated, transmitting the counting address as an address signal when the refresh active signal is activated, and transmitting the target address as the address signal when one or more signals of the first and second target active signals are activated, and a word line controller suitable for activating a word line corresponding to the address signal when the active command or the refresh active signal is activated.

An address corresponding to each of the (K−1)th word line and the (K+1)th word line may have a value obtained by adding or subtracting 1 to or from the value of the address corresponding to the Kth word line, and an address corresponding to each of the (K−2)th word line and the (K+2)th word line may have a value obtained by adding or subtracting 2 to or from the value of the address corresponding to the Kth word line.

The address generator may generate a value obtained by adding or subtracting a preset value to or from the input value, and when the first target active signal is activated, the address generator may generate a value obtained by adding or subtracting 1 to or from the input value, and when the second target active signal is activated, the address generator may generate a value obtained by adding or subtracting 2 to or from the input value.

The address storage unit may store the address of a word line of which the active count is equal to or more than a preset count among the plurality of word lines, or store the address of a word line of which the active frequency is equal to or more than a preset frequency among the plurality of word lines.

The address storage unit stores the address of a word line selected at a preset time between two adjacent refresh sections.

DETAILED DESCRIPTION

Figure 1:
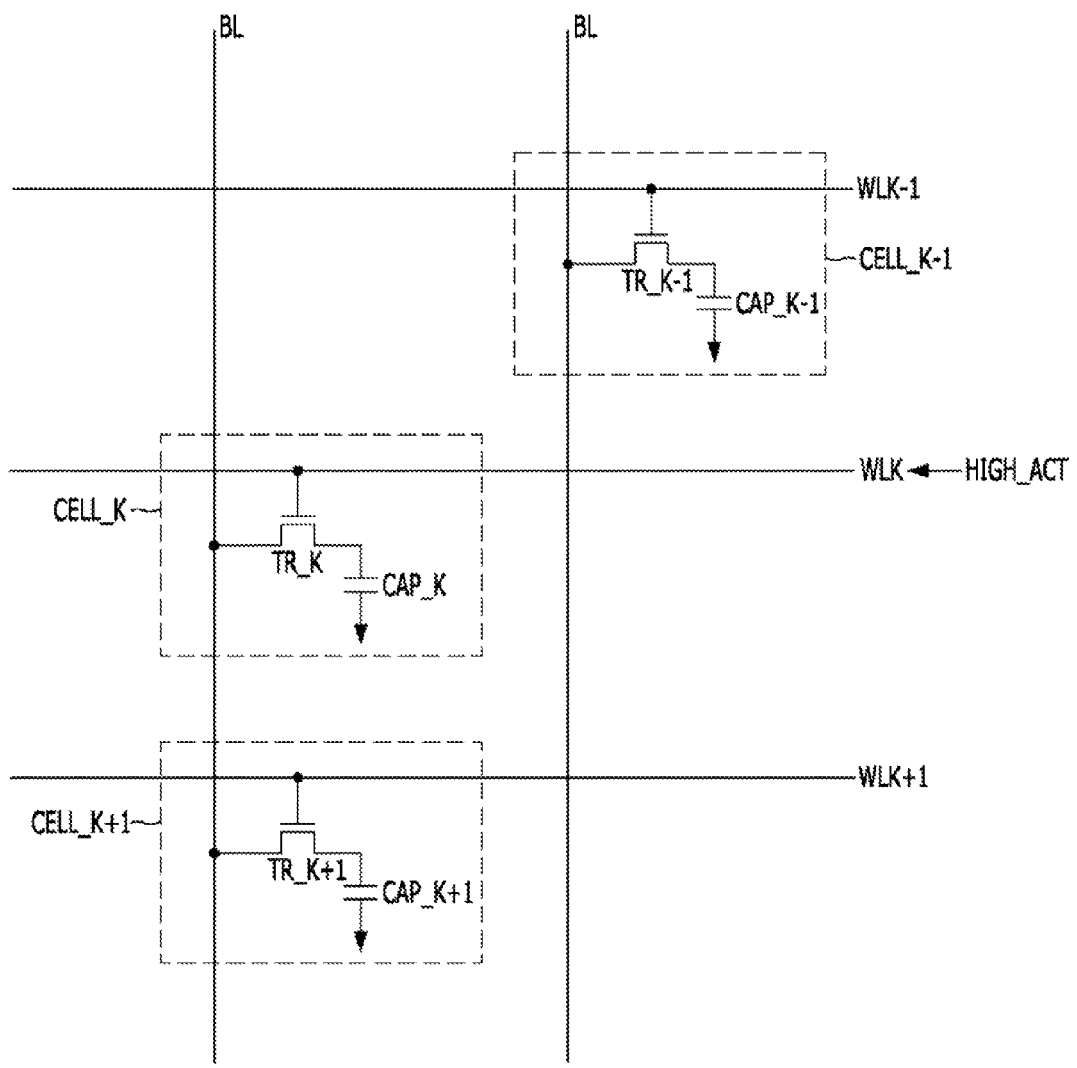
FIG. 1 is a circuit diagram illustrating a part of a cell array included in a memory.

Various examples and implementations of the disclosed technology will be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the present invention to those skilled in the art.

Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate. It is also noted that in this specification, "connected/coupled" refers to one component not only directly coupling another component but also indirectly coupling another component through an intermediate component. In addition, a singular form may include a plural form as long as it is not specifically mentioned in a sentence.

When a word line is activated, precharged or refreshed, a memory cell coupled to the word line is refreshed.

In the description, an adjacent word line refers to a word line, which is disposed adjacent to a specific word line such that data of memory cells coupled to the adjacent word line may be influenced by an active operation of the specific word line.

FIG. 1 is a circuit diagram illustrating a portion of a cell array of a memory device.

FIG. 1 shows a plurality of word lines WLK−1 WLK and WLK+1 disposed in parallel to each other in a cell array. The Kth word line WLK marked with 'HIGH_ACT' is a word line that is frequently activated, compared with the (K−1)th word line WLK−1 and the (K+1)th word line WLK+1. The (K−1)th word line WLK−1 and the (K+1)th word line WLK+1 are neighboring word lines disposed adjacent to the Kth word line WLK. The word lines WLK−1, WLK and WLK+1 are coupled with memory cells CELL_K−1, CELL_K and CELL_K+1, respectively. The memory cells CELL_K−1, CELL_K and CELL_K+1 also coupled to bit lines BL include cell transistors TR_K−1, TR_K and TR_K+1 and cell capacitors CAP_K−1, CAP_K and CAP_K+1, respectively.

When the Kth word line WLK is activated or deactivated (pre-charged), the word line disturbance may occur and the voltages of the neighboring word lines WLK−1 and WLK+1 are raised or dropped due to the coupling effect occurring between the Kth word line WLK and the neighboring word lines WLK−1 and WLK+1, which may affect the amount of charges stored in the cell capacitors CAP_K−1 and CAP_K+1 of the neighboring word lines WLK−1 and WLK+1. Therefore, as the Kth word line WLK is activated and pre-charged frequently, the Kth word line WLK frequently toggles between the active state and the pre-charge state, the amount of charges stored in the cell, capacitors CAP_K−1 and CAP_K+1 or the data stored in the memory cells CELL_K−1 and CELL_K+1 of the neighboring word lines WLK−1 and WLK+1 may be damaged.

Additionally, since the electromagnetic wave generated as the Kth word line WLK toggles between the active state and the pre-charge state causes electrons to go in and out of the cell capacitors of the neighboring word lines, the data of the memory cells coupled with the neighboring word lines may be damaged.

Figure 2:
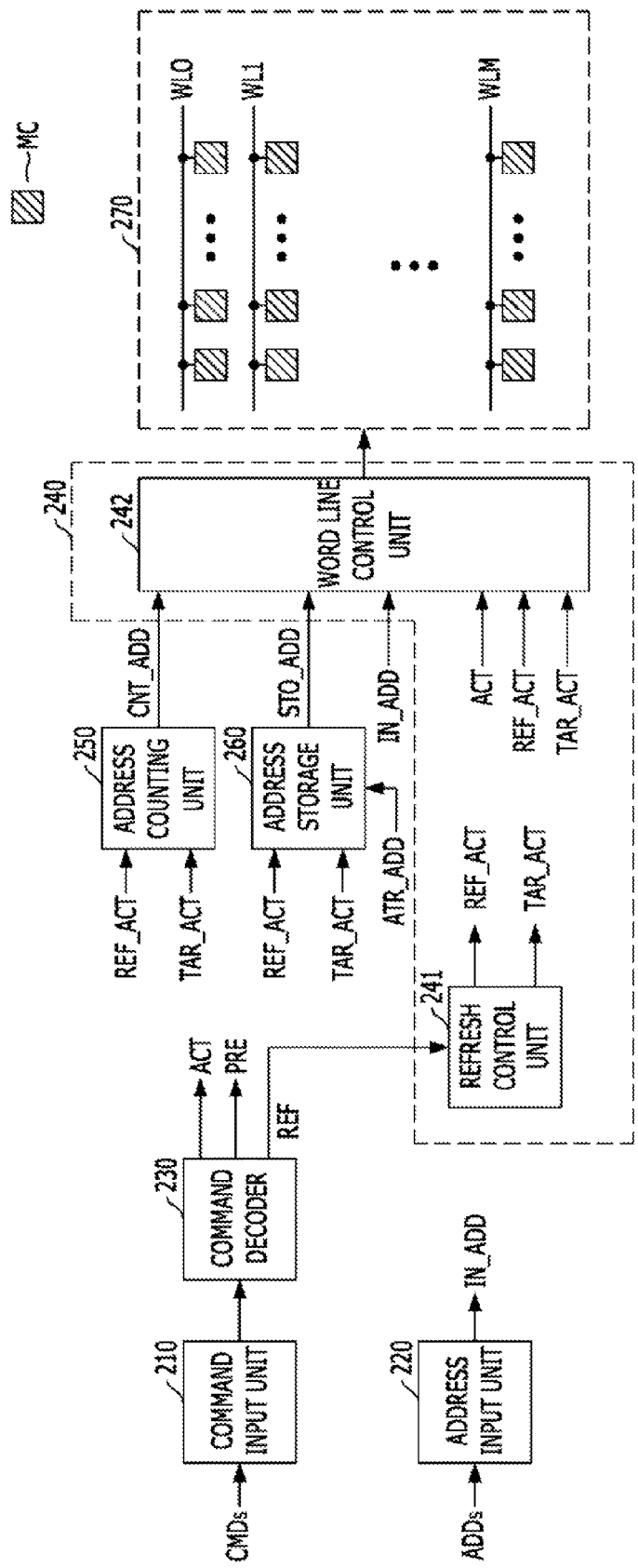
FIG. 2 is a block diagram illustrating a memory in accordance with an embodiment of the present invention.

FIG. 2 is a block diagram illustrating a memory in accordance with an embodiment of the present invention.

Referring to FIG. 2, the memory may include a command input unit 210, an address input unit 220, a command decoder 230, a control unit 240, an address counting unit 250, an address storage unit 260 and a cell array 270. The cell array 270 may include a plurality of word lines WL0 to WLM respectively coupled to one or more memory cells.

The command input unit 210 may receive commands CMDs applied from a memory controller and the address input unit 220 may receive addresses ADDs applied from the memory controller. The commands CMDs and the addresses ADDs may be multi-bit signals.

The command decoder 230 may decode the command CMDs inputted through the command input unit 210 and generate an active command ACT and a refresh command REF. When a combination of the input command signals CMDs corresponds to the active command ACT, the command decoder 230 may activate the active command ACT and when a combination of the input command signals CMDs corresponds to the refresh command REF, the command decoder 230 may activate the refresh command REF.

The address counting unit 250 may perform counting one or more times when the refresh command REF is applied and generate a counting address CNT_ADD, which indicates one of the multiple word lines WL0 to WLN, using the counting result. The address counting unit 250 may increases a value of the counting address CNT_ADD by one whenever a refresh active signal REF_ACT is activated. For example, the value of the counting address CNT_ADD may be changed in such a manner that the next value of the counting address CNT_ADD indicates the (K+1)th word line when the current value of the counting address CNT_ADD indicates the Kth word line.

The address counting unit 250 may not perform the counting operation when a target active signal TAR_ACT is activated. The refresh active signal REF_ACT and the target active signal TAR_ACT will be described below.

The address storage unit 260 may store an address of a word line selected by the word line control unit 242 included in the control unit 240 among the plurality of word line WL0 to WLM at a non-refreshing time point. The non-refreshing time point may be included between two sequential refresh sections. That is, at the non-refreshing time point, the memory may perform an operation other than the refresh operation. A reason that the address storage unit 260 stores the address of the selected word line among the plurality of word lines WL0 to WLM at the non-refreshing time point may be described as follows.

The memory during an active operation may select a word line among the plurality of word lines WL0 to WLM and activate the selected word line when an active command is applied. The memory during an access operation may access an activated word line and precharge the accessed active word line. Accessing the activated word line may mean writing data to or reading data from one or more memory cells coupled to the activated word line. The memory during a refresh operation may select a word line corresponding to a counting address among the plurality of word lines WL0 to WLM and sequentially refresh one or more of the multiple word lines WL0 to WLM using the counting address whenever the refresh command REF is applied one time.

The memory may access the selected word line among the plurality of word lines during time section other than a refresh section, during which the refresh operation may be performed. That is, the word line selected during time section other than the refresh section may be the one activated for access. As described above, word line disturbance may occur when a specific word line is activated at a high frequency. Thus, the currently-activated word line is highly likely to cause word line disturbance than other word lines.

Thus, the address storage unit 260 may store as a stored address STO_ADD the address of the currently selected word line or the currently-activated word line among the plurality of word lines WL0 to WLM at the non-refreshing time point during time section other than the refresh section or between two sequential refresh sections. Furthermore, the address storage unit 260 may output the stored address STO_ADD stored at the non-refreshing time point when the refresh active signal REF_ACT and the target active signal TAR_ACT are activated. The address storage unit 260 will be described below in detail with reference to FIG. 4.

The control unit 240 during an active operation selects a word line corresponding to an input address IN_ADD inputted through the address input unit 220 among the plurality of word lines WL0 to WLM and activates the selected word line when the active command ACT is applied. The control unit 240 during an access operation may access an activated word line and precharge the accessed active word line. Accessing the activated word line may mean writing data to or reading data from one or more memory cells MC coupled to the activated word line.

The control unit 240 during a normal refresh operation selects a word line corresponding to the counting address CNT_ADD among the plurality of word lines WL0 to WLM and refreshes the selected word line when the refresh command REF is applied. The control unit 240 may sequentially refresh one or more of the multiple word lines WL0 to WLM using the counting address CNT_ADD whenever the refresh command REF is applied one time.

The control unit 240 during a target refresh operation selects one or more word lines adjacent to a word line corresponding to the stored address STO_ADD stored in the address storage unit 260 and refreshes the selected word lines in response to Nth application of the refresh command REF where N is a natural number.

The normal refresh operation and the target refresh operation may be performed during the refresh section. The refresh section may be set from when a refresh command is applied to when a refresh operation for one or more word lines in response to the applied refresh command is completed.

The control unit 240 may refresh sequentially one or more word lines corresponding to the counting address CNT_ADD in response to every application of the refresh command REF during the normal refresh operation and refresh one or more word lines adjacent to the word line corresponding to the stored address STO_ADD in response to Nth application of the refresh command REF during the target refresh operation. The control unit 240 may refresh one or more adjacent word lines selected by the stored address STO_ADD as well as the word line selected by the counting address CNT_ADD in response to Nth application of the refresh command REF during the target refresh operation. Further, the control unit 240 may refresh only one or more adjacent word lines selected by the stored address STO_ADD in response to Nth application of the refresh command REF during the target refresh operation.

The value of N may be changed depending on design. In the following descriptions, as an example, N is set to four (N=4) and the control unit 240 may refresh one word line corresponding to the counting address CNT_ADD when the refresh command REF is applied during the normal refresh operation and refresh two word lines adjacent to the word line according to the stored address STO_ADD whenever the refresh command REF is applied four times during the target refresh operation. When the word line corresponding to the stored address STO_ADD is the word line WLK, the two adjacent word lines may be a first adjacent word line WLK−1 and a second adjacent word line WLK+1. The first and second adjacent word lines may be selected in a different order depending on design.

The control unit 240 may include a refresh control unit 241 and a word line control unit 242.

The refresh control unit 241 activates the refresh active signal REF_ACT and the target active signal TAR_ACT in response to the refresh command REF applied from the command input unit 210 through the command decoder 230. The refresh control unit 241 may refresh active signal REF_ACT one or more times in response to every application of the refresh command REF and activate the target active signal TAR_ACT in response to every Nth application of the refresh command REF. The target active signal TAR_ACT may indicate the target refresh operation that is performed during a target refresh operation section. The refresh control unit 241 may count a number of applications of the refresh command REF. When the number of applications of the refresh command REF reaches the number N, the refresh control unit 241 may activate the target active signal TAR_ACT and then count the number of applications of the refresh command REF from the beginning.

For example, the refresh control unit 241 may activate the refresh active signal REF_ACT in response to every application of the refresh command REF. Then, when the number of applications of the refresh command REF reaches four (N=4), the refresh control unit 41 may activate the target active signal TAR_ACT and activate the refresh active signal REF_ACT two times for refreshing the first and second adjacent word lines WKL−1 and WLK+1.

The word line control unit 242 selects and activates a word line corresponding to the input address IN_ADD when the active command ACT is applied and selects and activates a word line corresponding to the counting address CNT_ADD when the refresh active signal REF_ACT is activated. When the target active signal TAR_ACT is activated, the word line control unit 242 sequentially selects and refreshes the first and second adjacent word lines WKL−1 and WLK+1 adjacent to the word line WLK corresponding to the stored address STO_ADD.

In the above-described example, when the refresh command REF is applied for the Nth time, the stored address STO_ADD may be used to select a word line for the target refresh operation. The address counting unit 250 may not perform the counting operation when the target active signal TAR_ACT is activated. Therefore all of the word lines may be refreshed through the normal refresh operation.

The memory in accordance with the embodiment of the present invention may sequentially refresh a plurality of word lines WL0 to WLM during the normal refresh operation and additionally refresh one or more word lines adjacent to a word line corresponding to the stored word line at a non-refreshing time point through the target refresh operation whenever the refresh command is applied N times. Thus, it is possible to prevent a data loss of word lines adjacent to a word line, which is activated at a high frequency.

Figure 3:
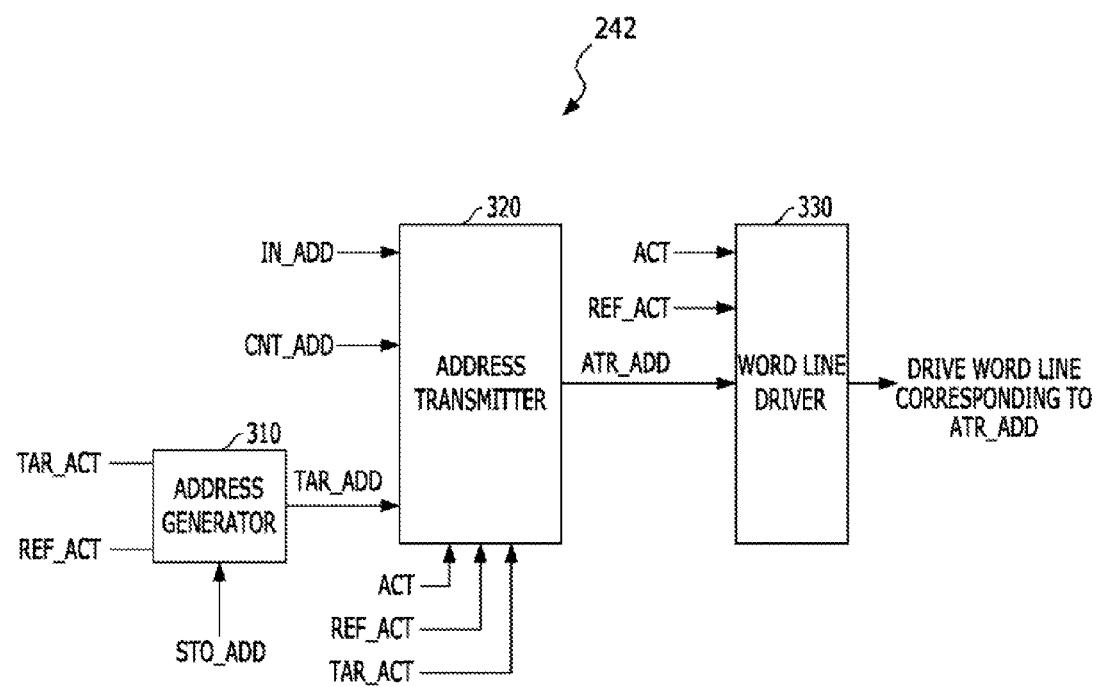
FIG. 3 is a block diagram illustrating a word line control unit of the memory shown in FIG. 2.

FIG. 3 is a block diagram illustrating a word line control unit 242 of the memory shown in FIG. 2.

Referring to FIG. 3, the word line control unit 242 may include an address generator 310, an address transmitter 320 and a word line driver 330.

The address generator 310 sequentially generates a first adjacent address corresponding to the first adjacent word line and a second adjacent address corresponding to the second adjacent word line using the stored address STO_ADD outputted from the address storage unit 260 and outputs each of the generated addresses as a target address TAR_ADD when the target active signal TAR_ACT is activated. For example, when the target active signal TAR_ACT is activated, the address generator 310 may generate the first adjacent address that may be lesser by 1 than the stored address STO_ADD and output the generated first adjacent address as the target address TAR_ADD in response to a first activation of the refresh active signal REF_ACT during activation of the target active signal TAR_ACT and generate the second adjacent address that may be greater by 1 than the stored address STO_ADD and output the generated second adjacent address as the target address TAR_ADD in response to a second activation of the refresh active signal REF_ACT during activation of the target active signal TAR_ACT. The first and second adjacent addresses may be outputted in a different order depending on design.

The address transmitter 320 transmits one of the input address IN_ADD, the counting address CNT_ADD and the target address TAR_ADD as an address signal ATR_ADD. The address transmitter 320 may transmit as the address signal ATR_ADD the input address IN_ADD when the active command ACT is applied, the counting address CNT_ADD when the refresh active signal REF_ACT is activated and the target address TAR_ADD when the refresh active signal REF_ACT and the target active signal TAR_ACT are activated.

The word line driver 330 activates a word line corresponding to the address signal ATR_ADD among the plurality of word lines WL0 to WLM when one of the active command ACT and the refresh active signal REF_ACT is activated. The word line driver 330 may drive the word line corresponding to the address signal ATR_ADD to a voltage corresponding to the activation level.

FIGS. 4A to 4D are block diagrams illustrating an address storage unit 260 of the memory shown in FIG. 2.

Referring to FIGS. 4A to 4D, the address storage unit 260 may include a storage 420 and one of signal generators 410A, 410B, 410C and 410D.

The address storage unit 260 may be implemented in various ways to store an address of a word line selected by the control unit 240 among the plurality of word lines WL0 to WLM at the non-refreshing time point. Hereafter, four implementations will be described.

Figure 4A:
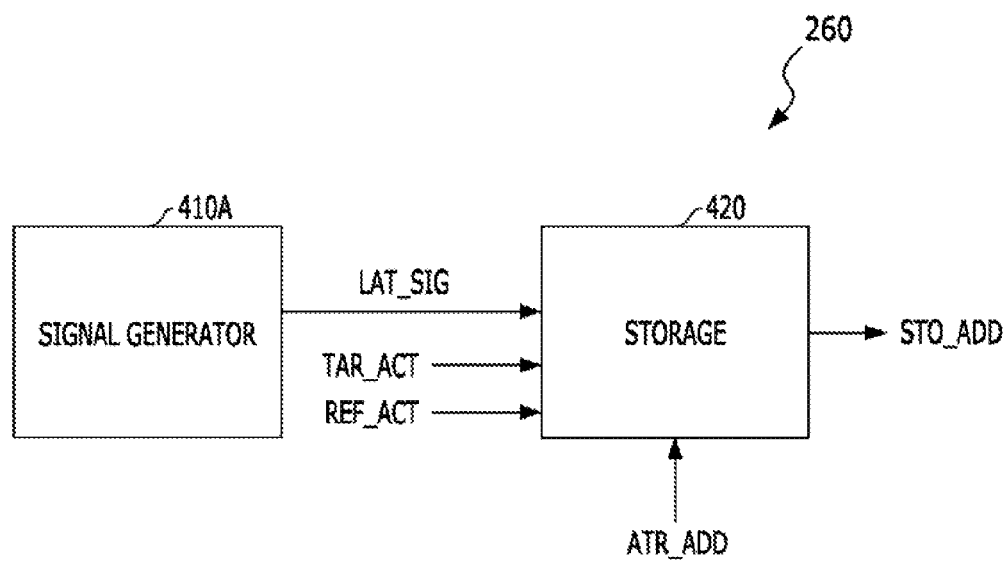
FIGS. 4A to 4D are block diagrams illustrating an address storage unit of the memory shown in FIG. 2.

FIG. 4A is a block diagram illustrating the address storage unit 260 as an implementation of the embodiment of the present invention.

Referring to FIG. 4A, the signal generator 410A generates a latch signal LAT_SIG, which is periodically activated within a preset period, and the storage 420 stores the address signal ATR_ADD when the latch signal LAT_SIG is activated.

The memory in accordance with the embodiment of the present invention may periodically perform the refresh operation during the refresh section in response to the periodical refresh command REF. The signal generator 410A may activate the latch signal LAT_SIG at the preset period such that the latch signal LAT_SIG may be activated during time section other than the refresh section.

The preset period may differ depending on design. Thus, a number of addresses to be stored as the stored address STO_ADD in the address storage unit 260 per N applications of the refresh command REF may depend on the preset period the latch signal LAT_SIG. As the preset period becomes shorter, the addresses to be stored in the storage 420 per N applications of the refresh command REF may increase and as the set period becomes longer, the addresses to be stored in the storage 420 per N applications of the refresh command REF may decrease.

The storage 420 may store the address signal ATR_ADD as the stored address STO_ADD when the latch signal LAT_SIG is activated. The address signal ATR_ADD may indicate a word line currently selected by the control unit 240, regardless of a currently performed operation including the active operation, the write operation and the read operation. The storage 420 may store the address of the currently-selected word line as the address signal ATR_ADD when the latch signal LAT_SIG is activated. The storage 420 may output the stored address STO_ADD when the refresh active signal REF_ACT and the target active signal TAR_ACT are activated.

Figure 4B:
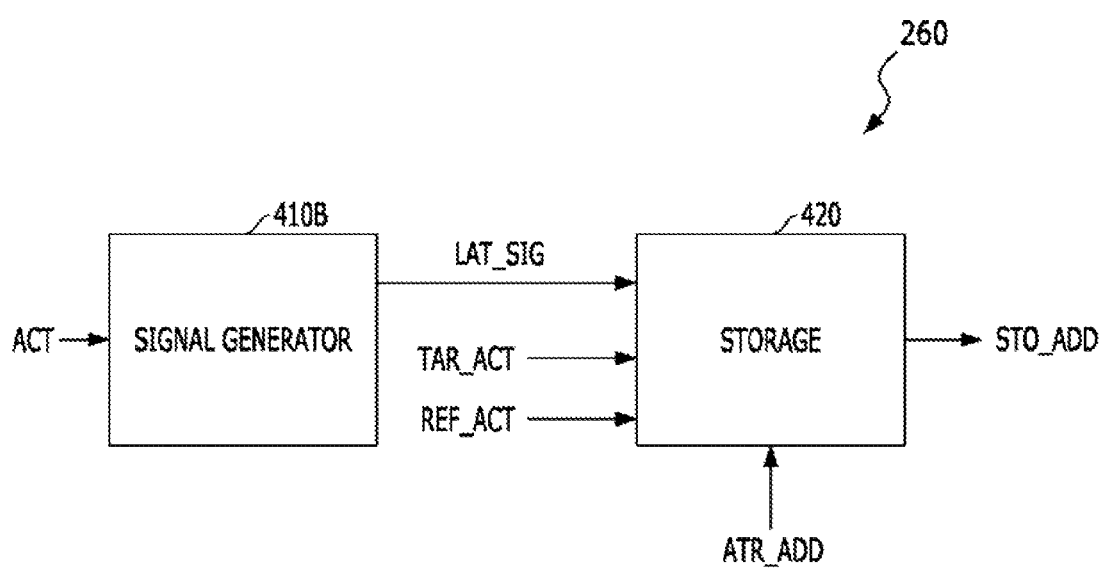

FIG. 4B is a block diagram illustrating the address storage unit 260 as another implementation of the embodiment of the present invention.

The address storage unit 260 may include a signal generator 410B and the storage 420. The storage 420 shown in FIG. 4B may be the same as the one shown in FIG. 4A. The signal generator 410B counts a number of applications of the active command ACT and generates a latch signal LAT_SIG, which is activated in response to Mth (M is a natural number) application of the active command ACT, and the storage 420 stores the address signal ATR_ADD when the latch signal LAT_SIG is activated.

The memory in accordance with the embodiment of the present invention may activate a word line when the active command ACT is applied and perform an access operation such as a write or read operation on the activated word line. The signal generator 410B may activate the latch signal LAT_SIG in response to Mth application of the activate command ACT, such that the latch signal LAT_SIG may be activated during time section other than the refresh section. The signal generator 410B may count a number of applications of one of a precharge command PRE, a write command and a read command instead of the activate command ACT to generate the latch signal LAT_SIG.

The number M of applications of the active command ACT as a threshold to activate the latch signal LAT_SIG may differ depending on design. Thus, a number of addresses to be stored as the stored address STO_ADD in the storage 420 per N applications of the refresh command REF may depend on the number M of applications of the activate command ACT. As the number M becomes greater, the addresses to be stored in the storage 420 per N applications of the refresh command REF may decrease and as the number M becomes lesser, the addresses to be stored in the storage 420 per N applications of the refresh command REF may increase.

Figure 4C:
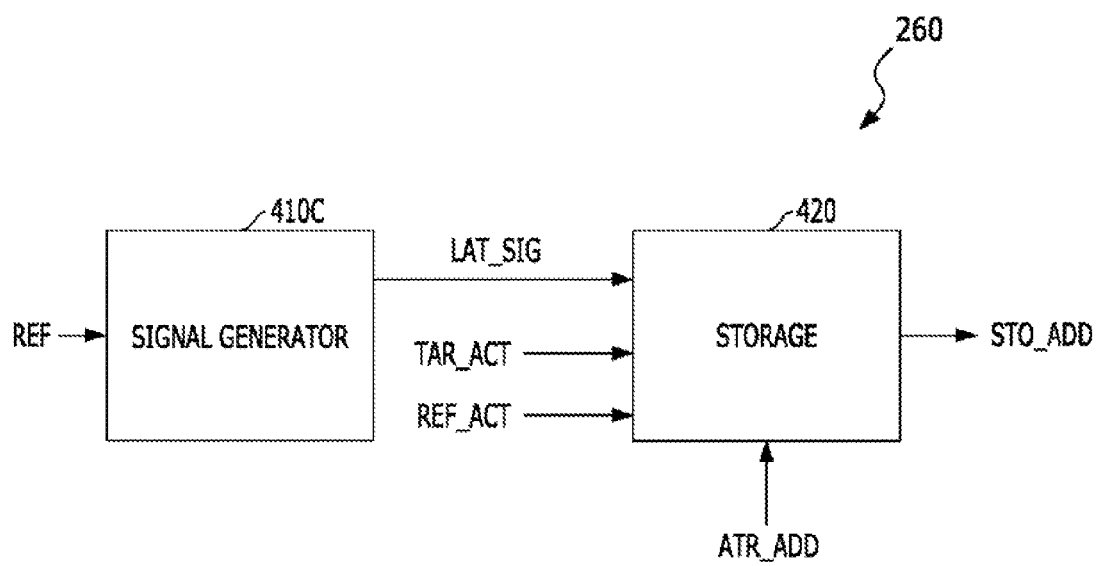

FIG. 4C is a block diagram illustrating the address storage unit 260 as yet another implementation of the embodiment of the present invention.

The address storage unit 260 may include a signal generator 410C and the storage 420. The storage 420 shown in FIG. 4C may be the same as the one shown in FIG. 4A. The signal generator 410C generates a latch signal LAT_SIG, which is activated a preset time after Qth (Q is a natural number) application of the refresh command REF and the storage 420C stores the address signal ATR_ADD when the latch signal LAT_SIG is activated.

Since the refresh section is preset, the signal generator 410C may activate the latch signal LAT_SIG the preset time after Mth application of the refresh command REF such that the latch signal LAT_SIG may be activated during time section other than the refresh section.

The number Q of applications of the refresh command REF as a threshold to activate the latch signal LAT_SIG may differ depending on design. Thus, a number of addresses to be stored as the stored address STO_ADD in the storage 420 per N applications of the refresh command REF may depend on the number Q of applications of the refresh command REF. As the number Q becomes greater, the addresses to be stored in the storage 420 per N applications of the refresh command REF may decrease and as the number Q becomes lesser, the addresses to be stored in the storage 420 per N applications of the refresh command REF may increase.

Figure 4D:
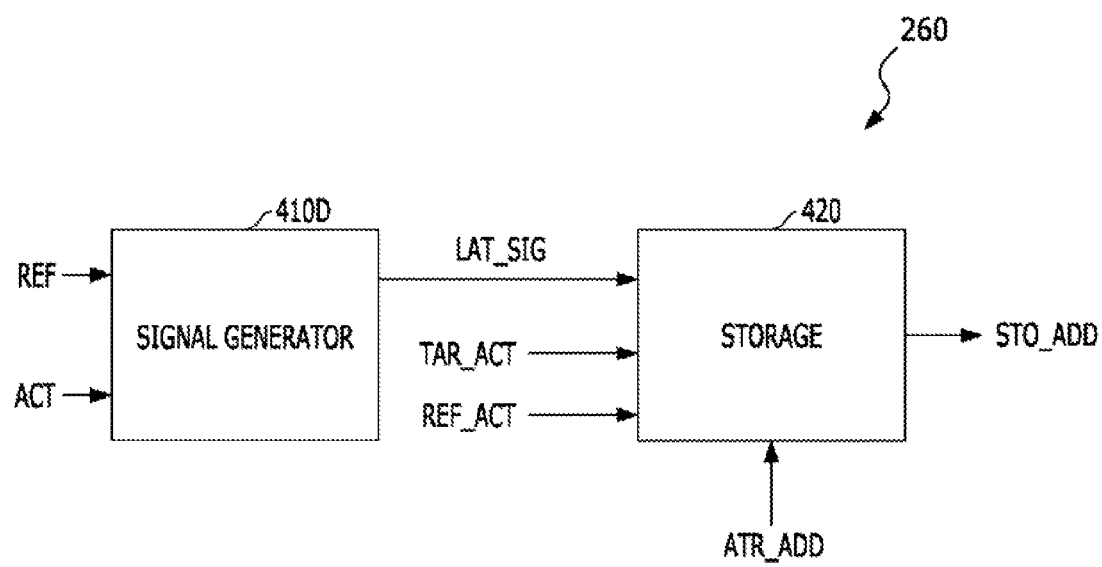

FIG. 4D is a block diagram illustrating the address storage unit 260 as another implementation of the embodiment of the present invention.

The address storage unit 260 may include a signal generator 410D and the storage 420. The storage 420 shown in FIG. 4D may be the same as the one shown in FIG. 4A. The signal generator 410D generates a latch signal LAT_SIG, which is activated in response to Mth (M is a natural number) application of the active command ACT after Qth (Q is a natural number) application of the refresh command REF and the storage 420D stores the address signal ATR_ADD when the latch signal LAT_SIG is activated.

Since the refresh section is preset and the memory in accordance with the embodiment of the present invention may activate a word line when the active command ACT is applied and perform an access operation such as a write or read operation on the activated word line, the signal generator 410D may activate the latch signal LAT_SIG in response to Mth application of the active command ACT after Qth application of the refresh command REF such that the latch signal LAT_SIG may be activated during time section other than the refresh section.

The number Q of applications of the refresh command REF and the number M of applications of the active command ACT as a threshold to activate the latch signal LAT_SIG may differ depending on design. Thus, a number of addresses to be stored as the stored address STO_ADD in the storage 420 per N applications of the refresh command REF may depend on the number Q of applications of the refresh command REF and the number M of applications of the active command ACT. As the number Q or M becomes greater, the addresses to be stored in the storage 420 per N applications of the refresh command REF may decrease and as the number Q or M becomes lesser, the addresses to be stored in the storage 420 per N applications of the refresh command REF may increase.

In addition to the embodiments according to the present inventions described above, the address storage unit 260 may be implemented in various ways to store an address of a word line selected by the control unit 240 among the plurality of word lines WL0 to WLM at the non-refreshing time point.

The memory in accordance with the embodiment of the present invention may store an address of a word line, which is performing an active operation, and refresh the word line corresponding to the stored address during the refresh operation, thereby reducing the possibility that word line disturbance occurs. Furthermore, since the memory in accordance with the embodiment of the present invention does not need a component for detecting a word line that may cause word line disturbance, that is, a word line that is activated at a high frequency, the area of the circuit may be reduced.

Figure 5:
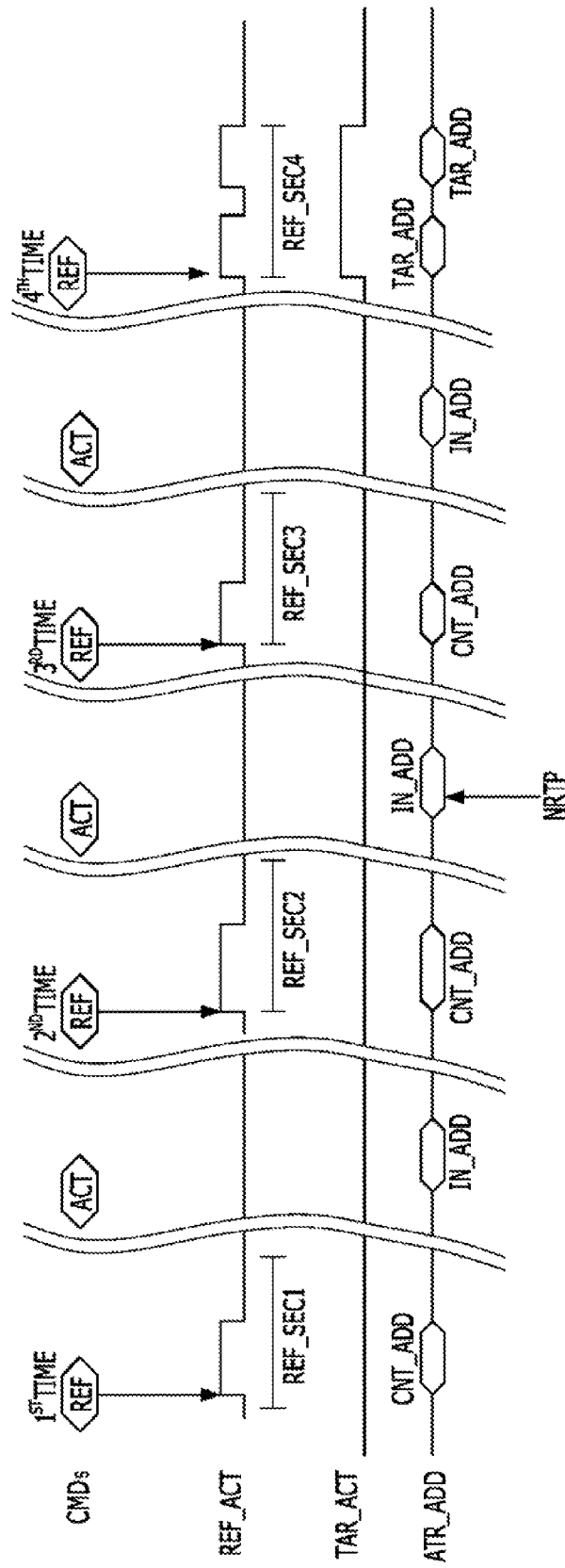
FIG. 5 is a timing diagram illustrating an exemplary operation of the memory of the memory shown in FIG. 2.

FIG. 5 is a timing diagram illustrating an exemplary operation of the memory of the memory shown in FIG. 2.

FIG. 5 illustrates an exemplary case where one word line is refreshed per one application of the refresh command REF and two adjacent word lines, or the first and second adjacent word lines, according to the stored address STO_ADD are refreshed per four applications of the refresh command REF. The refresh command REF may be repeatedly applied to the memory with a preset interval and the active command ACT may be repeatedly applied to the memory between periodical applications of the refresh command REF.

Referring to FIGS. 2 to 5, the operation of the memory will be described.

When the refresh command REF is applied for the first time, the refresh active signal REF_ACT may be activated. At this time, the counting address CNT_ADD may have a value corresponding to a word line, for example WL0, and thus the word line WL0 may be refreshed. When the refresh command REF is applied for the second and third times, the counting address CNT_ADD may sequentially have values for the word lines WL1 and WL2, and the word lines WL1 and WL2 may be sequential y refreshed. The respective refresh operations may be performed during preset refresh sections REF_SEC1 to REF_SEC3 shown in FIG. 5.

When the active command ACT is applied between applications of the refresh command REF, a word line corresponding to the input address IN_ADD may be activated. The address storage unit 260 may store the address signal ATR_ADD at the non-refreshing time point NRTP. FIG. 5 shows as an example, the non-refreshing time point NRTP between the second and third refresh sections REF_SEC2 and REF_SEC3.

When the refresh command REF is applied for the fourth time, the target active signal TAR_ACT may be activated. When the refresh active signal REF_ACT is activated for the first time during activation of the target active signal TAR_ACT, the first adjacent word line WLK−1, which corresponds to the target address TAR_ADD according to the stored address STO_ADD, may be refreshed regardless of the ongoing normal refresh operation. Then, when the refresh active signal REF_ACT is activated for the second time during the activation of the target active signal TAR_ACT, the second adjacent word line WLK+1 which corresponds to the target address TAR_ADD according to the stored address STO_ADD, may be refreshed.

After fourth application of the refresh command REF, the plurality of word lines WL0 to WLN may be refreshed according to the counting address CNT_ADD in response to application of the refresh command REF. At every fourth application of the refresh command REF, the memory may generate the target address TAR_ADD based on the stored address STO_ADD stored at a non-refreshing time point and refresh one or more adjacent word lines corresponding to the target address TAR_ADD.

The memory in accordance with the embodiment of the present invention may activate one or more word lines per every application of the refresh command REF and refresh one or more adjacent word lines corresponding to the target address TAR_ADD per preset number, which may be greater than 2 such as 4 described above, applications of the refresh command REF. The memory in accordance with the embodiment of the present invention may refresh a word line corresponding to the counting address CNT_ADD as well as adjacent word lines corresponding to the target address TAR_ADD per preset number of applications of the refresh command REF.

Figure 6:
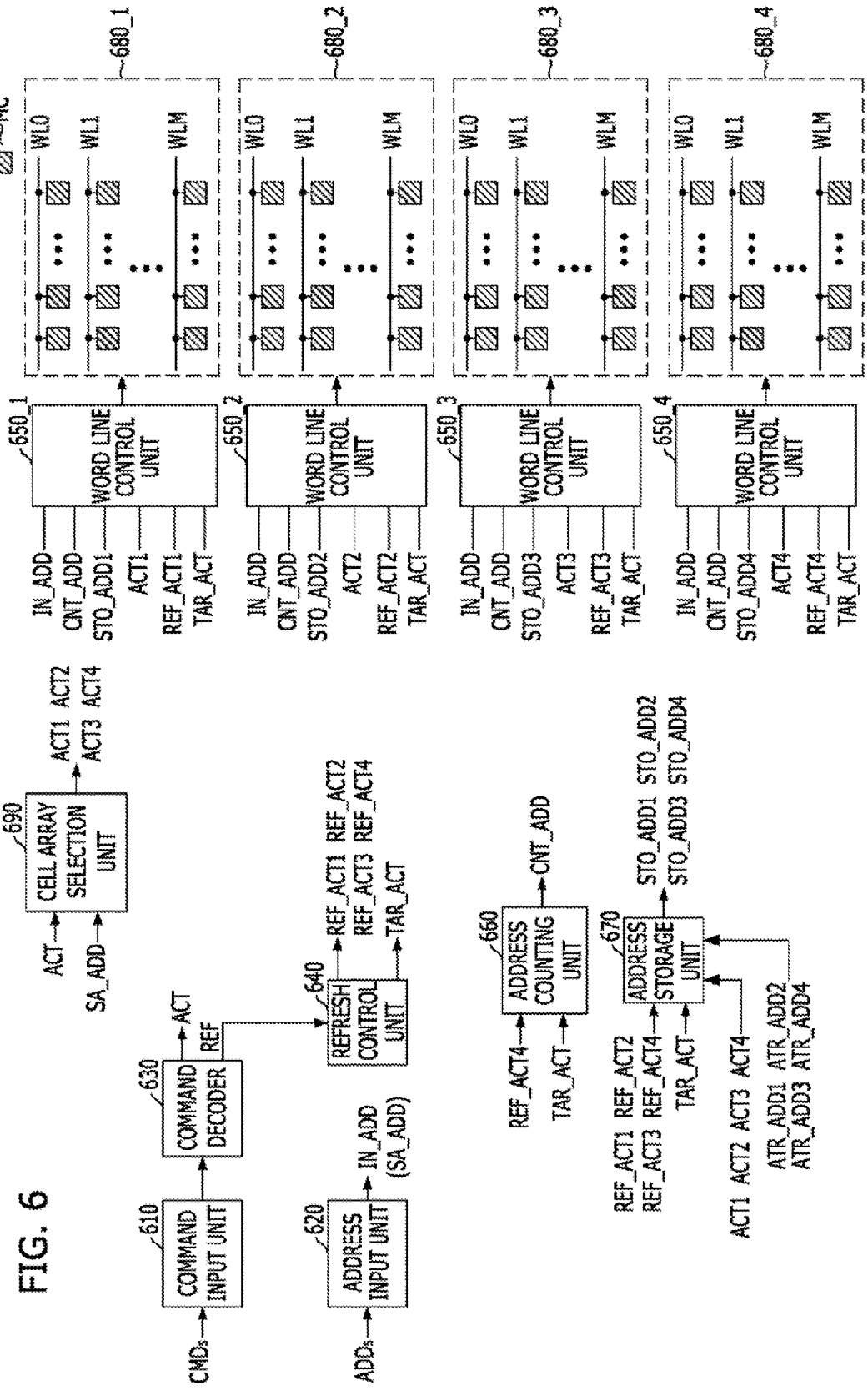
FIG. 6 is a block diagram illustrating a memory in accordance with another embodiment of the present invention.

FIG. 6 is a block diagram illustrating a memory in accordance with another embodiment of the present invention.

Referring to FIG. 6, the memory may include a command input unit 610, an address input unit 620, a command decoder 630, a refresh control unit 640, a plurality of word line control units 650_1 to 650_4, an address counting unit 660, an address storage unit 670, a plurality of cell arrays 680_1 to 680_4 and a cell array selection unit 690. FIG. 6 shows four cell arrays 680_1 to 680_4, which may vary according to circuit design.

The command input unit 610, the address input unit 620 and the command decoder 630 are the same as the command input unit 210, the address input unit 220 and the command decoder 230 of FIG. 2, respectively. In accordance with the embodiment of the present invention, an input address IN_ADD received through the address input unit 620 may include a cell array address SA_ADD for selecting one of the plurality of cell arrays 680_1 to 680_4.

The cell array selection unit 690 generates a plurality of active signals ACT1 to ACT4 corresponding to the cell arrays 680-1 to 680-4 respectively. When an active command ACT is applied with the input address IN_ADD including the cell array address SA_ADD indicating one of the plurality of cell arrays 680_1 to 680_4, the cell array selection unit 690 may activate one of the plurality of active signals ACT1 to ACT4 corresponding to the cell array address SA_ADD. For example, the cell array selection unit 690 may activate the first active signal ACT1 when the active command ACT is applied and the cell array address SA_ADD indicates the first cell array 680_1.

The refresh control unit 640 controls a refresh operation of the memory in response to every application of the refresh command REF. The refresh control unit 640 may sequentially activate refresh active signals REF_ACT1 to REF_ACT4 respectively corresponding to the cell arrays 680_1 to 680_4 in response to every application of the refresh command REF. Furthermore, the refresh control unit 640 may activate a target active signal TAR_ACT and sequentially activate the refresh active signals REF_ACT1 to REF_ACT4 one or more times in response to every Nth application of the refresh command REF.

In the following descriptions, the refresh control unit 640 sequentially activates the plurality of refresh active signals REF_ACT1 to REF_ACT4 one time per every application of the refresh command REF and two times per every Nth application of the refresh command REF. There is time gap between activations of each of the refresh active signals REF_ACT1 to REF_ACT4 for reducing a peak current caused by the refresh operation. All of the refresh active signals REF_ACT1 to REF_ACT4 may be activated within a refresh section, that is, a refresh cycle tREF.

Each of the plurality of word line control units 650_1 to 650_4 activates a word line corresponding to the input address IN_ADD when a corresponding one of the plurality of active signals ACT1 to ACT4 is activated. Furthermore, when each of the plurality of refresh active signals REF_ACT1 to REF_ACT4 is activated, the corresponding one of the plurality of the word line control units 650_1 to 650_4 may activate a word line corresponding to the counting address CNT_ADD. When the target active signal TAR_ACT is activated, each of the word line control units 650_1 to 650_4 may activate adjacent word lines respectively selected through stored addresses STO_ADD1 to STO_ADD4 stored in the address storage unit 670. Each of the word line control units 650_1 to 650_4 may be the same as the word line control unit 250 shown in FIG. 2. The word line control units 650_1 to 650_4 will be described below in detail with reference to FIG. 7.

The address counting unit 660 performs counting one or more times when the refresh command REF is applied and generates the counting address CNT_ADD, which indicates one of the multiple word lines WL0 to WLN included in each of the plurality of cell arrays 680_1 to 680_4, using the counting result. The address counting unit 660 may increase a value of the counting address CNT_ADD by one whenever one of the plurality of refresh active signals REF_ACT1 to REF_ACT4 is activated. FIG. 6 illustrates an example that the address counting unit 660 performs counting in response to the refresh active signal REF_ACT4. For example, the value of the counting address CNT_ADD may be changed in such a manner that the next value of the counting address CNT_ADD indicates the (K+1)th word line when the current value of the counting address CNT_ADD indicates the Kth word line. The plurality of word lines WL0 to WLM of the cell arrays 680_1 to 680_4 may be sequentially refreshed according to the counting address CNT_ADD.

The address storage unit 670 stores addresses of word lines selected by each of the word line control units 650_1 to 650_4 among the plurality of word lines WL0 to WLM of each of the plurality of cell arrays 680_1 to 680_4 at a non-refreshing time point. The non-refreshing time point may be included between two sequential refresh sections. That is, at the non-refreshing time point, the memory may perform an operation other than the refresh operation. A reason why the address storage unit 670 stores the addresses of the selected word lines of the plurality of cell arrays 680_1 to 680_4 at the non-refreshing time point is the same as described above with reference to FIG. 2.

The address storage unit 670 may store as one of stored addresses STO_ADD1 to STO_ADD4 the address of the currently selected word line or the currently-activated word line among the plurality of word lines WL0 to WLM of one of the plurality of cell arrays 680_1 to 680_4 selected by the cell array selection unit 690 at the non-refreshing time point during time section other than the refresh section or between two sequential refresh sections. Furthermore, the address storage unit 670 may output one of the stored addresses STO_ADD1 to STO_ADD4 stored at the non-refreshing time point when corresponding one of the plurality of refresh active signals REF_ACT1 to REF_ACT4 and the target active signal TAR_ACT are activated. For example, the address storage unit 670 may output the stored address STO_ADD1 corresponding to the first cell array 680_1 among the stored addresses STO_ADD1 to STO_ADD4 when the target active signal TAR_ACT and the first refresh active signal REF_ACT1 are activated. The plurality of word line control units 650_1 to 650_4 may refresh first and second adjacent word lines adjacent to a word line corresponding to each of the stored addresses STO_ADD1 to STO_ADD4 in the corresponding cell arrays according to the addresses STO_ADD1 to STO_ADD4 outputted from the address storage unit 640. The address storage unit 670 will be described below in detail with reference to FIG. 7.

During the normal refresh operation, the memory in accordance with the embodiment of the present invention may sequentially refresh the plurality of word lines in the plurality of cell arrays. Whenever the refresh command is applied N times, the memory may additionally refresh one or more adjacent word lines adjacent to each of the word lines corresponding to the stored addresses in the plurality of cell arrays at a non-refreshing time point through the target refresh operation. Thus, the memory in accordance with the embodiment of the present invention may prevent a data loss of word lines adjacent to a word line, which is activated at a high frequency.

Figure 7:
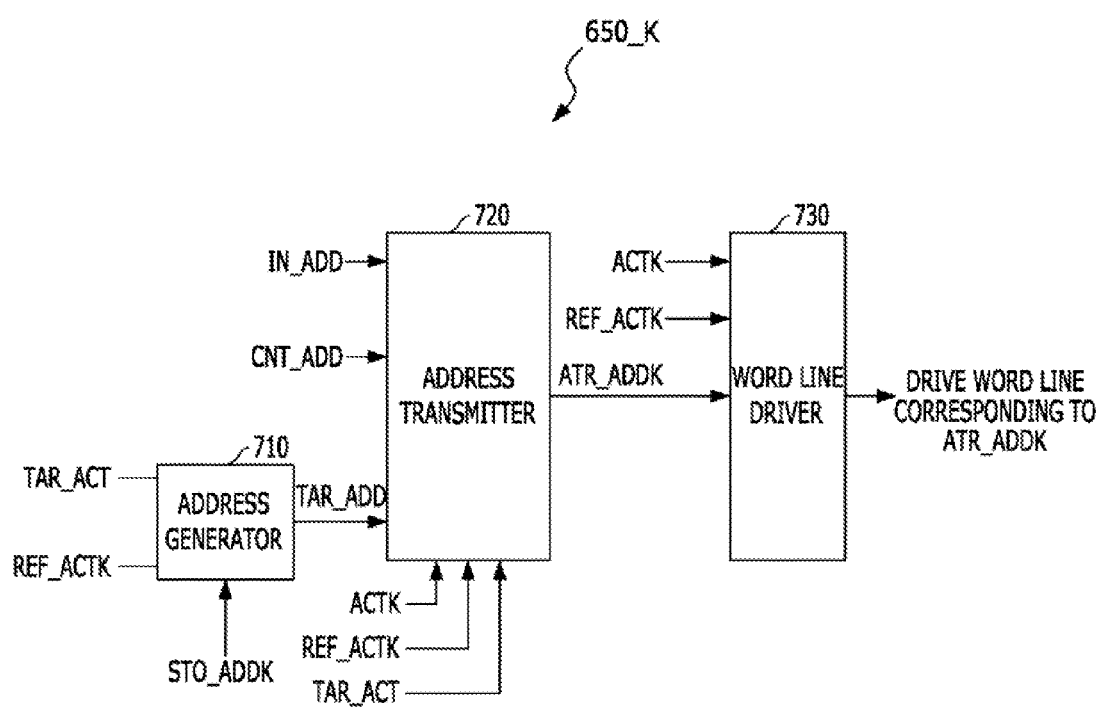
FIG. 7 is a block diagram illustrating a Kth word line control unit of the memory shown in FIG. 6.

FIG. 7 is a block diagram illustrating the Kth word line control unit 650_K of the memory shown in FIG. 6.

Referring to FIG. 7, the word line control unit 650_K may include an address generator 710, an address transmitter 720 and a word line driver 730.

The address generator 710 sequentially generates a first adjacent address corresponding to the first adjacent word line and an second adjacent address corresponding to the second adjacent word line using the stored address STO_ADDK outputted from the address storage unit 760 and outputs each of the generated addresses as the target address TAR_ADDK when the target active signal TAR_ACT is activated. For example, when the target active signal TAR_ACT is activated, the address generator 710 may generate the first adjacent address that may be lesser by 1 than the address STO_ADDK and output the generated first address as the target address TAR_ADD in response to a first activation of the refresh active signal REF_ACTK during activation of the target active signal TAR_ACT. Furthermore, the address generator 710 may generate the second adjacent address that may be greater by 1 than the address STO_ADDK and output the generated second adjacent address as the target address TAR_ADD in response to a second activation of the refresh active signal REF_ACTK during activation of the target active signal TAR_ACT. The first and second adjacent addresses may be outputted in a different order depending on design.

The address transmitter 720 transmits one of the input address IN_ADD, the counting address CNT_ADD and the target address TAR_ADDK as the address signal ATR_ADDK. The address transmitter 720 may transmit as the address signal ATR_ADDK the input address IN_ADD when the Kth active signal ACTK is activated, the counting address CNT_ADD when the Kth refresh active signal REF_ACTK is activated, and the target address TAR_ADD when the target active signal TAR_ACT and the Kth refresh active signal REF_ACTK are activated.

The word line driver 730 activates a word line corresponding to the address signal ATR_ADDK among the plurality of word lines WL0 to WLM of the corresponding cell array 680_K when one of the Kth active signal ACTK and the Kth refresh active signal REF_ACK is activated. For reference, K is a natural number ranging from 1 to 4.

Figure 8:
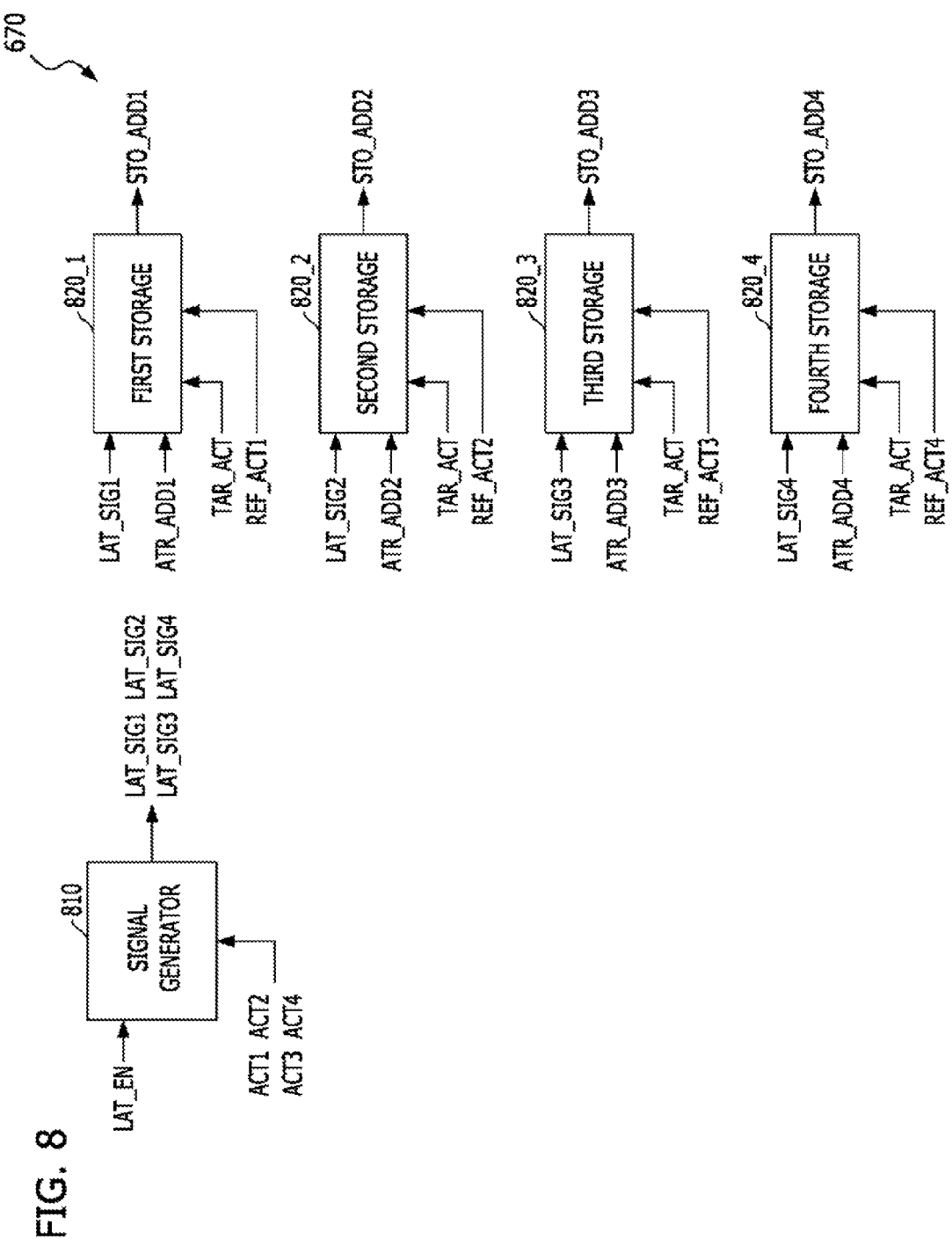
FIG. 8 is a block diagram illustrating an address storage unit of the memory shown in FIG. 6.

FIG. 8 is a block diagram illustrating the address storage unit 670 of the memory shown in FIG. 6.

Referring to FIG. 8, the address storage unit 670 may include a signal generator 810 and a plurality of storages 820_1 to 820_4.

The signal generator 810 generates a plurality of latch signals LAT_SIG1 to LAT_SIG4. As described above with reference to FIG. 4, the address storage unit 670 may be implemented in various ways to store the stored addresses STO_ADD1 to STO_ADD4 or to activate the latch signals LAT_SIG1 to LAT_SIG4 at the non-refreshing time point. The plurality of latch signals LAT_SIG1 to LAT_SIG4 may correspond to the plurality of cell arrays 680_1 to 680_4 and the plurality of storages 820_1 to 820_4, respectively. Hereafter, when the plurality of latch signals LAT_SIG1 to LAT_SIG4 are activated at a preset period, will be described.

An enable signal LAT_EN may be periodically activated during time section other than the refresh section. When the enable signal LAT_EN and one of the first to fourth active signals ACT1 to ACT4 are activated, the signal generator 810 may activate one of the plurality of latch signals LAT_SIG1 to LAT_SIG4 corresponding to the activated one of the first to fourth active signals ACT1 to ACT4. For example, when the first active signal ACT1 and the enable signal LAT_EN are activated, the signal generator 810 may activate the first latch signal LAT_SIG1 corresponding to the first active signal ACT1.

Each of the storages 820_1 to 820_4 stores corresponding one of the address signals ATR_ADD1 to ATR_ADD4 as the stored addresses STO_ADD1 to STO_ADD4 when corresponding one of the first to fourth latch signals LAT_SIG1 to LAT_SIG4 is activated. Each of the address signals ATR_ADD1 to ATR_ADD4 may indicate a word line currently selected by corresponding one of the plurality of word line control units 650_1 to 650_4, regardless of currently performed operation including the active operation, the write operation and the read operation. When the target active signal TAR_ACT is activated, each of the storages 820_1 to 820_4 may output corresponding one of the stored addresses STO_ADD1 to STO_ADD4 in response to activation of corresponding one of the refresh active signals REF_ACT1 to REF_ACT4. For example, the first storage 820_1 may store the first address signal ATR_ADDR1 as the stored address STO_ADD1 when the first latch signal LAT_SIG1 is activated and output the stored address STO_ADD1 when the target active signal TAR_ACT and the first refresh active signal REF_ACT1 are activated.

Figure 9:
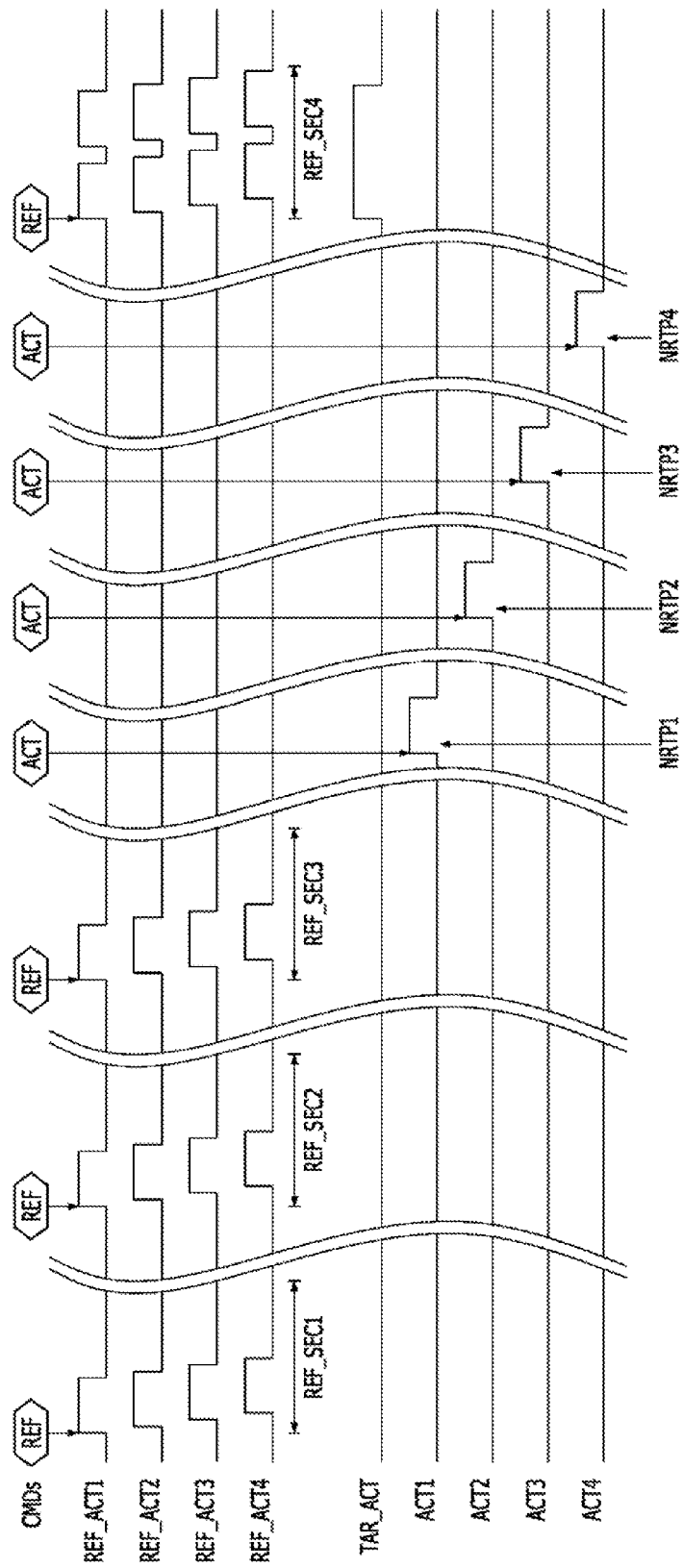
FIG. 9 is a timing diagram illustrating an exemplary operation of the memory of the memory shown in FIG. 6.

FIG. 9 is a timing diagram illustrating an exemplary operation of the memory of the memory shown in FIG. 6.

FIG. 9 illustrates an exemplary case where the word lines in the plurality of cell arrays 680_1 to 680_4 are sequentially refreshed per one application of the refresh command REF. Two adjacent word lines, or the first and second adjacent word lines adjacent to each of word lines in the plurality of cell arrays 680_1 to 680_4 corresponding to the stored addresses STO_ADD1 to STO_ADD4 are refreshed per four applications of the refresh command REF. The refresh command REF may be repeatedly applied to the memory within a preset interval and the active command ACT may be repeatedly applied to the memory between periodic applications of the refresh command REF. As an example, the normal refresh operation is started from the word line WL0 and word lines corresponding to the stored addresses STO_ADD1 to STO_ADD4 in the respective cell arrays at a non-refreshing time point are represented by WLX, WLY, WLZ and WLU, respectively, where X, Y, Z and U are natural numbers ranging from 1 to M.

Referring to FIGS. 6 to 8, the operation of the memory will be described.

When the refresh command REF is applied for the first time, the plurality of refresh active signals REF_ACT1 to REF_ACT4 may be sequentially activated and the word line corresponding to the counting address CNT_ADD in each of the cell arrays 680_1 to 680_4 may be refreshed. The counting address CNT_ADD may have a value corresponding to the word line WL0. When the refresh command REF is applied for the second and third times, the counting address CNT_ADD may sequentially have values for the word lines WL1 and WL2 and the word lines WL1 and WL2 corresponding to the counting address CNT_ADD in each of the cell arrays 680_1 to 680_4 may be sequentially refreshed. The respective refresh operations may be performed during preset refresh sections REF_SEC1 to REF_SEC3 shown in FIG. 9.

When the active command ACT is applied between applications of the refresh command REF, a word line corresponding to the input address IN_ADD may be activated in the cell array selected by the cell array address SA_ADD. The address storage unit 670 may store the address signals ATR_ADD1 to ATR_ADD4 of the selected cell array at non-refreshing time points NRTP1 to NRTP4, respectively. FIG. 9 shows as an example the non-refreshing time points NRTP1 to NRTP4 between the third and fourth refresh sections REF_SEC3 and REF_SEC4. Each of the first to fourth active signals ACT1 to ACT4 may be activated when the active command ACT is applied and a corresponding cell array is selected.

When the refresh command REF is applied for the fourth time, the target active signal TAR_ACT may be activated. When the plurality of refresh active signal REF_ACT to REF_ACT4 are sequentially activated for the first time during activation of the target active signal TAR_ACT, the first adjacent word lines WLX−1, WLY−1, WLY−1 and WLU−1, which respectively correspond to the target addresses TAR_ADD1 to TAR_ADD4 according to the stored addresses STO_ADD1 to STO_ADD4, may be refreshed regardless of the ongoing normal refresh operation. Then, when the plurality of refresh active signals REF_ACT1 to REF_ACT4 are activated for the second time during activation of the target active signal TAR_ACT, the second adjacent word lines WLX+1, WLY+1, WLY+1 and WLU+1, which respectively correspond to the target addresses TAR_ADD1 to TAR_ADD4 according to the stored addresses STO_ADD1 STO_ADD4, are refreshed.

After fourth application of the refresh command REF, the plurality of word lines WL0 to WLN in each of the cell arrays 680_1 to 680_4 may be refreshed according to the counting address CNT_ADD in response to application of the refresh command REF. At every fourth application of the refresh command REF, the memory may generate the target addresses TAR_ADD1 to TAR_ADD4 based on the stored addresses STO_ADD1 to STO_ADD4 stored at a non-refreshing time point and refresh one or more adjacent word lines corresponding to the target addresses TAR_ADD1 to TAR_ADD4.

Figure 10:
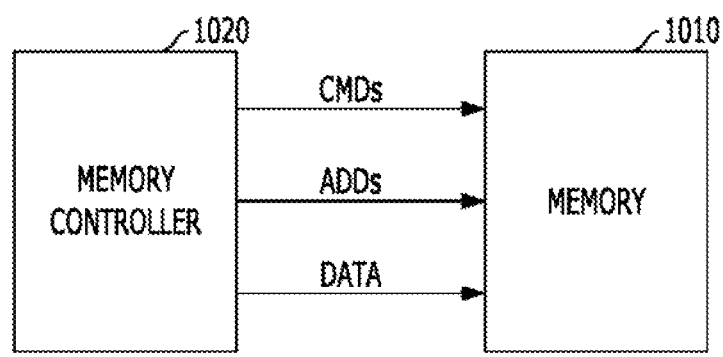
FIG. 10 is a block diagram illustrating a memory system in accordance with another embodiment of the present invention.

FIG. 10 is a block diagram illustrating a memory system in accordance with another embodiment of the present invention.

Referring to FIG. 10, the memory system includes a memory 1010 and a memory controller 1020.

The memory controller 1020 controls the operation of the memory 1010 by applying commands CMDs and addresses ADDs to the memory 1010 and exchanges data DATA with the memory 1010 during a read or write operation. The memory controller 1020 may transmit the commands CMDs to input a refresh command REF, an active command ACT, or a precharge command PRE to the memory 1010. When the active command ACT is inputted, the memory controller 1020 may transmit the addresses ADDs to the memory controller 1020 so as to select a cell array and a word line to activate. When the refresh command REF is inputted, an address CNT_ADD generated inside the memory 1010 or an address STO_ADD stored in the memory 1010 are used. Thus, the memory controller 1020 does not need to transmit the addresses ADDs to the memory 1010.

The memory 1010 of FIG. 9 receives the commands CMDs and the addresses ADDs and performs an active operation when the active command ACT is inputted or performs a refresh operation when the refresh command REF is inputted. At this time, the memory 1010 performs the active operation or the refresh operation in the same manner as described above with reference to FIGS. 2 to 9. Furthermore, when a read or write command is applied from the memory controller 1020, the memory 1010 exchanges data DATA with the memory controller 1020.

For reference, bit lines BL are not illustrated in the cell arrays 270 and 680_1 to 680_4 of FIGS. 2 and 6.

Figure 11:
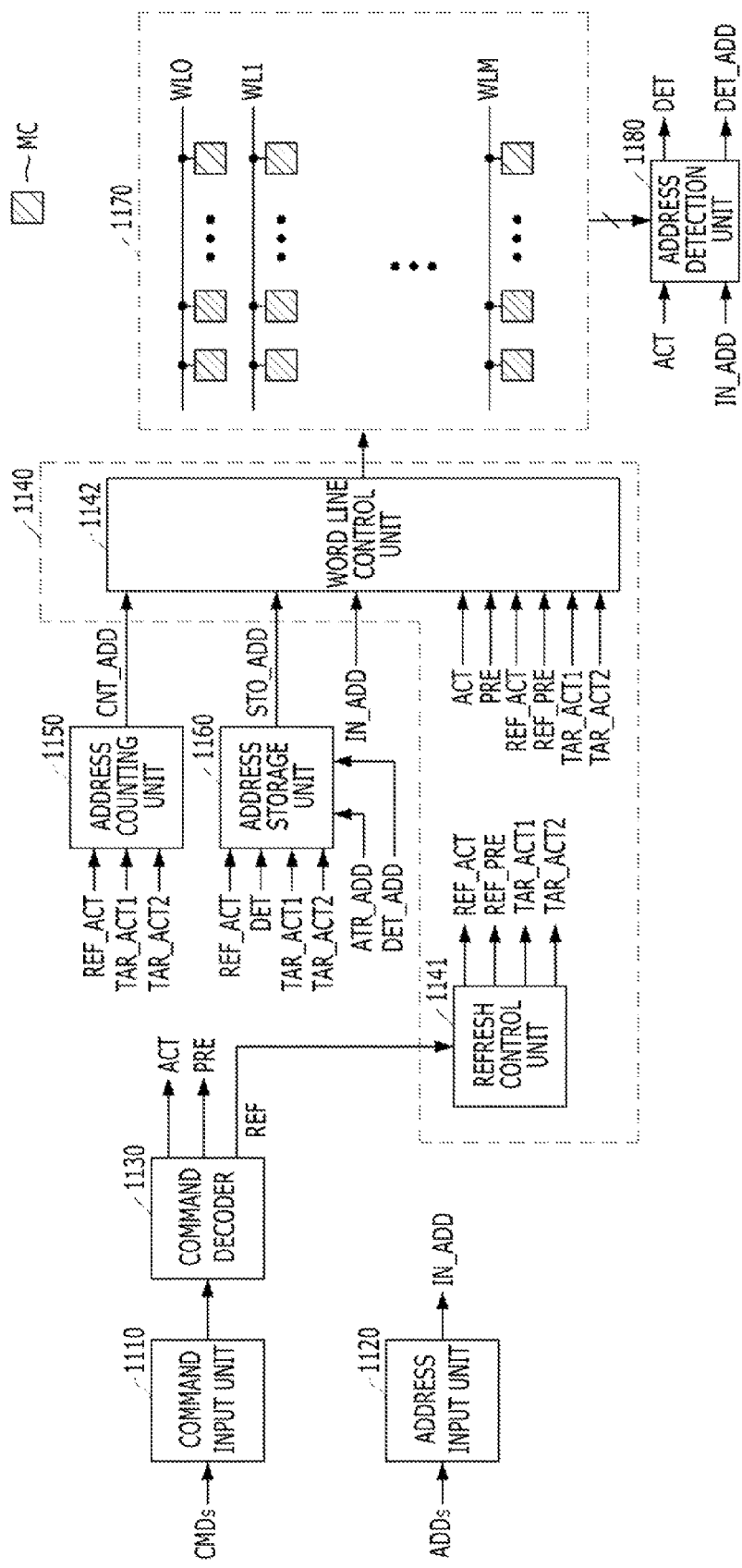
FIG. 11 is a configuration diagram of a memory in accordance with an embodiment of the present invention.

FIG. 11 is a configuration diagram of a memory in accordance with an embodiment of the present invention.

As illustrated in FIG. 11, the memory may include a command input unit 1110, an address input unit 1120, a command decoder 1130, a control unit 1140, an address counting unit 1150, an address storage unit 1160, and a cell array 1170 including a plurality of word lines WL0 to WLM each coupled to one or more memory cells MC. The memory may further include an address detection unit 1180.

Referring to FIG. 11, the memory will be described.

The command input unit 1110 may receive commands CMDs applied from a memory controller, and the address input unit 1120 may receive addresses ADDs applied from the memory controller (not illustrated in FIG. 11). Each of the commands CMDs and the addresses ADDs may include multi-bit signals.

The command decoder 1130 may decode the commands CMDs inputted through the command input unit 1110 and generate an active command ACT, a refresh command REF, and a precharge command PRE. The command decoder 230 may activate the active command ACT when a combination of the input command signals CMDs indicates the active command ACT, activate the refresh command REF when a combination of the input command signals CMDs indicates the refresh command REF, and activate the precharge command PRE when a combination of the input command signals CMDs indicates the precharge command PRE.

When the active command ACT is applied, the control unit 1140 may activate a word line corresponding to an input address IN_ADD inputted through the address input unit 1120, among the plurality of word lines WL0 to WLM. When the precharge command PRE is applied, the control unit 1140 may precharge the activated word line.

When the refresh command REF is applied, the control unit 1140 may refresh a word line corresponding to a counting address CNT_ADD among the plurality of word lines WL0 to WLM. The control unit 1140 may sequentially refresh one or more word lines using the counting address CNT_ADD, whenever the refresh command REF is applied (normal refresh operation).

When the refresh command REF is applied N times where N is a natural number, the control unit 1140 may refresh one or more first adjacent word lines which are adjacent to a word line corresponding to an address STO_ADD stored in the address storage unit 1160 (first target refresh operation). Furthermore, when the refresh command REF is applied M times where M is a natural number, the control unit 1140 may refresh one or more second adjacent word lines which are adjacent to the first adjacent word line (second target refresh operation).

The control unit 1140 may perform the second target refresh operation when the refresh command REF is applied by a multiple of N and M (when both of the first and second target refresh operations need to be performed).

The normal refresh operation and the target refresh operation may be performed during a preset refresh section. The refresh section may be set from when a refresh command is applied to when a refresh operation (active-precharge) for one or more word lines in response to the applied refresh command is completed. For reference, when the refresh command REF is applied one time, the control unit 1140 may refresh one word line or sequentially refresh two or more word lines. This configuration may differ depending on design.

The control unit 1140 may include a refresh control unit 1141 and a word line control unit 1142 for the above-described operation.

Hereafter, the case in which N is set to 8 (N=8), M is set to 64 (M=64), and the control unit 1140 refreshes two word fines when the refresh command REF is applied one time will be described.

When a word line corresponding to the stored address STO_ADD is a Kth word line WLK, the one or more first adjacent word lines may include one or more word lines of a (K−1)th word line WLK−1 and a (K+1)th word line WLK+1. The one or more second adjacent word lines may include one or more word lines of a (K−2)th word line WLK−2 and a (K+2)th word line WLK+2.

The refresh control unit 1141 may activate a refresh active signal REF_ACT one or more times (two times in the case of FIG. 11) in response to the refresh command REF. In this case, the refresh control unit 1141 may activate a first target active signal TAR_ACT1 when the refresh command REF is applied N times, or activate a second target active signal TAR_ACT2 when the refresh command REF is applied M times. The first target active signal TAR_ACT1 may include a signal which is activated during the first target refresh operation, and the second target active signal TAR_ACT2 may include a signal which is activated during the second target refresh operation. Furthermore, the refresh control unit 1141 may activate a refresh precharge signal REF_PRE at a preset time after the refresh active signal REF_ACT is activated.

The refresh control unit 1141 may count the refresh command REF. In this case, the refresh control unit 1141 may activate the first target active signal TAR_ACT1 when the refresh command REF is counted by a multiple of N, or activate the second target active signal TAR_ACT2 when the refresh command REF is counted by a multiple of M. The refresh control unit 1141 may activate only the second target active signal TAR_ACT2 when the refresh command REF is applied by a multiple of N and M.

The word line control unit 1142 may activate a word line corresponding to the input address IN_ADD when the active command ACT is applied, and refresh (active-precharge) a word line corresponding to the counting address CNT_ADD when the refresh active command REF_ACT is activated. In this case, the word line control unit 1142 may sequentially refresh one or more first adjacent word lines when the first target active signal TAR_ACT1 is activated, or sequentially refresh one or more second adjacent word lines when the second target active signal TAR_ACT2 is activated. The word line control unit 1142 may precharge the activated word line when the precharge command PRE is applied or the refresh precharge signal REF_PRE is activated.

When the refresh command REF is applied, the address counting unit 1150 may perform counting one or more times, and generate a counting address CNT_ADD using the counting result. The address counting unit 1150 may increase the value of the counting address CNT_ADD by 1 whenever the refresh active signal REF_ACT is activated. When the value of the address is increased by 1, it may indicate that the address is changed to select the (K+1)th word line WLK+1 in case where the Kth word line WLK was selected before. The address counting unit 1150 may not perform counting when a target refresh operation is performed.

The address storage unit 1160 may store an address DET_ADD detected by the address detection unit 1180, or store the address of a selected word line among the plurality of word lines WL0 to WLM at a preset time point. The preset time point may be included between two adjacent refresh sections. The preset time point may include an arbitrary time point at which the memory performs any other operation instead of a refresh operation. The address storage unit 1160 may output the stored address STO_ADD when one or more of the first and second target active signals TAR_ACT1 and TAR_ACT are activated.

The address detection unit 1180 may detect a high active word line, and output the address DET_ADD of the detected high active word line. The address detection unit 1180 may detect a word line of which the active count is equal to or more than a reference count or a word line of which the active frequency is equal to or more than a reference frequency, among the plurality of word lines WL0 to WLM, as a high active word line.

The address detection unit 1180 may receive the active command ACT and the input address IN_ADD, count how many times each word line is activated during a preset section, compare the active count of each word line to the preset reference count, and detect a word line which is activated by the reference count or more. Alternatively, the address detection unit 1180 may store the history in which each word line was activated during a preset section, and compare the active frequency of each word line to the preset reference frequency so as to detect a word line which is activated at the reference frequency or more. For reference, the history in which each word line was activated may indicate which word lines were activated during a preset section. Furthermore, the reference count and the reference frequency may be set in consideration of the level at which a memory cell MC can endure word line disturbance.

For example, the address detection unit 1180 may set the reference count to $10^5$ and detect a word line of which the active count is equal to or more than $10^5$. Alternatively, the address detection unit 1180 may set the reference frequency to the frequency at which a word line is activated two or more times per five active operations of the memory, and detect a word line which is activated two or more times per five active operations. For reference, the preset section may be set to correspond to a specific time through a timer. Furthermore, the active command ACT or the refresh command REF may be counted, and the preset section may be set to correspond to a section in which the command is inputted by a preset count.

Figure 12:
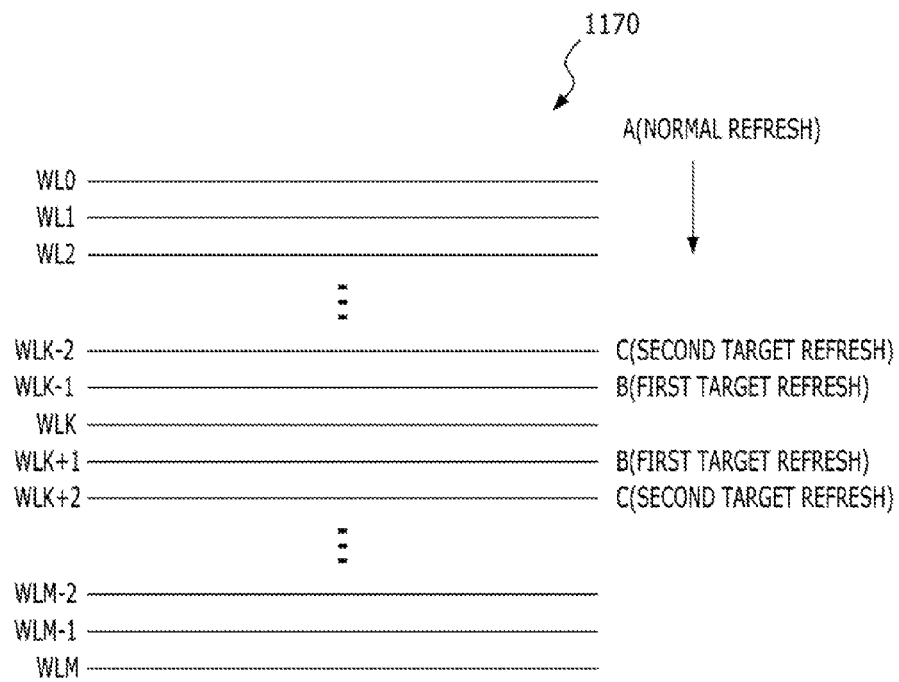
FIG. 12 is a diagram for explaining a refresh operation of the memory of FIG. 11.

FIG. 12 is a diagram for explaining the refresh operation of the memory of FIG. 11.

FIG. 12 illustrates a part of the cell array 1180 of FIG. 11. For convenience of description, memory cells coupled to a word line are not illustrated in FIG. 12. As illustrated in FIG. 12, the cell array 180 may include a plurality of word lines WL0 to WLM.

Hereafter, the case in which the address stored in the address storage unit 1160 corresponds to the Kth word line WLK will be described.

First, whenever the refresh command REF is applied one time, two word lines may be sequentially refreshed from the zero-th word line WL0 (A). At this time, the refreshed word lines may include a word line corresponding to the counting address CNT_ADD.

Whenever the refresh command REF is activated eight times, two first adjacent word lines WLK−1 and WLK+1 instead of the word line corresponding to the counting address CNT_ADD may be sequentially refreshed (b). The two first adjacent word lines WLK−1 and WLK+1 may be refreshed in order of WLK−1 and WLK+1 or refreshed in order of WLK+1 and WLK−1.

Finally, whenever the refresh command REF is activated 64 times, two second adjacent word lines WLK−2 and WLK+2 instead of the word line corresponding to the counting address CNT_ADD may be sequentially refreshed (C). The two second adjacent word lines WLK−2 and WLK+2 may be refreshed in order of WLK−2 and WLK+2 or refreshed in order of WLK+2 and WLK−2. At this time, the first adjacent word lines WLK−1 and WLK+2 may not be refreshed.

The memory may periodically refresh a word line (first adjacent word line) adjacent to a high active word line, in order to prevent data loss of the first adjacent word line (first target refresh). At this time, the refresh operation may correspond to an operation of active-precharging a word line. Thus, when the first target refresh operation is continuously performed, data of a word line (second adjacent word line) adjacent to the first adjacent word line may be lost. Thus, the memory may refresh the first adjacent word line at a first period, and refresh the second adjacent word line at a second period larger than the first period, thereby preventing data loss cased by word line disturbance.

Figure 13:
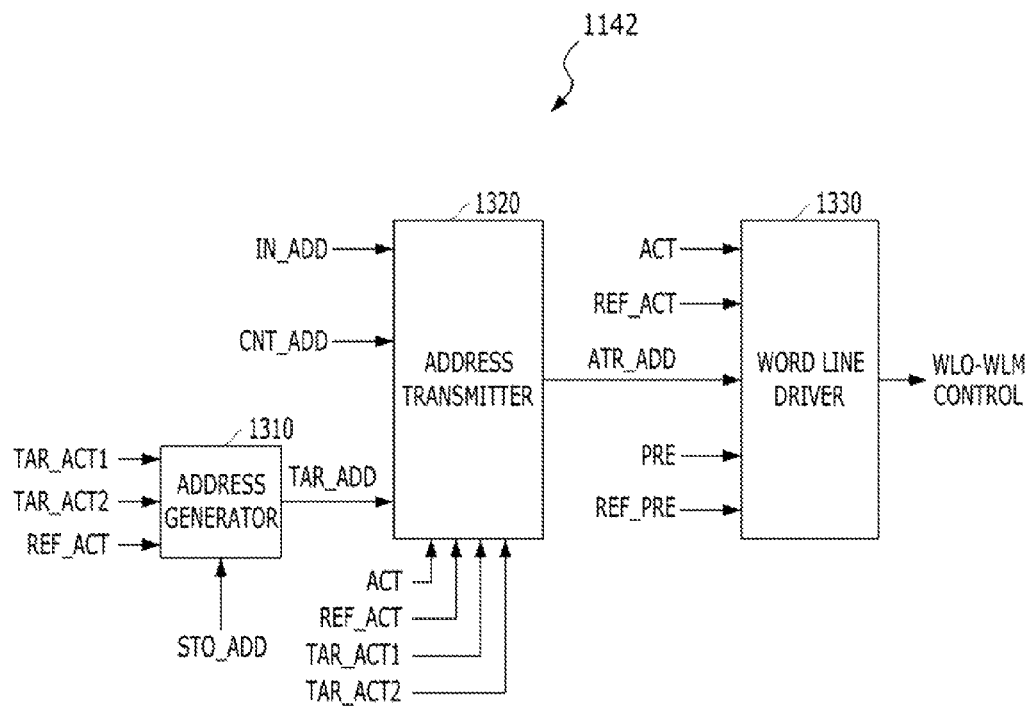
FIG. 13 is a configuration diagram of a word line control unit.

FIG. 13 is a configuration diagram of the word line control unit 1142.

As illustrated in FIG. 13, the word line control unit 1142 may include an address generator 1310, an address transmitter 1310, and a word line driver 1330.

The address generator 1310 may receive the address STO_ADD stored in the address storage unit 1160, generate target addresses TAR_ADD corresponding to the first adjacent word lines WLK−1 and WLK+1 when the first, target active signal TAR_ACT1 is activated, and generate target addresses TAR_ADD corresponding to the second adjacent word lines WLK−2 and WLK+2 when the second target active signal TAR_ACT2 is activated.

When the first target active signal TAR_ACT1 is activated, the values of the target addresses TAR_ADD may sequentially correspond to WLK−1 and WLK+1, or sequentially correspond to WLK+1 and WLK−1. When the second target active signal TAR_ACT2 is activated, the values of the target addresses TAR_ADD may sequentially correspond to WLK−2 and WLK+2, or sequentially correspond to WLK+2 and WLK−2.

The address transmitter 1320 may transmit one of the input address IN_ADD, the counting address CNT_ADD, and the target address TAR_ADD as an address signal ATR_ADD. The address transmitter 1320 may transmit the input address IN_ADD as the address signal ATR_ADD when the active command ACT is activated, transmit the counting address CNT_ADD as the address signal ATR_ADD when the refresh active signal REF_ACT is activated, and transmit the target address TAR_ADD as the address signal ATR_ADD when one or more of the first and second target active signals TAR_ACT1 and TAR_ACT2 are activated.

The word line driver 1330 may activate a word line corresponding to the address signal ATR_ADD among the plurality of word lines WL0 to WLM, when one of the active command ACT and the refresh active signal REF_ACT is activated. Furthermore, the word line driver 1330 may precharge the activated word line when one or more of the precharge command PRE and the refresh precharge signal REL_PRE are activated.

The plurality of word lines WL0 to WLM may correspond to successive address values according to an arrangement order thereof. (1) For example, the address corresponding to 'W0' may have the initial value (for example, 0), and each of the word lines WL1 to WLM following the word line W0 may have a value obtained by adding 1 to the address value of the previous word line. (2) On the other hand, the address corresponding to 'W0' may have the final value, and each of the word lines WL1 to WLM following the word line W0 may have a value obtained by subtracting 1 from the address value of the previous word line.

In the case of (1), the first adjacent word line WLK−1 or WLK+1 may have a value obtained by subtracting or adding 1 from or to the value of the address STO_ADD stored in the address storage unit 1160. In the case of (2), the first adjacent word line WLK−1 or WLK+1 may have a value obtained by adding or subtracting 1 to or from the address STO_ADD stored in the address storage unit 1160. Furthermore, in the case of (1), the second adjacent word line WLK−2 or WLK+2 may have a value obtained by subtracting or adding 2 from or to the address STO_ADD stored in the address storage unit 1160. In the case of (2), the second adjacent word line WLK−2 or WLK+2 may have a value obtained by adding or subtracting 2 to or from the address STO_ADD stored in the address storage unit 1160.

When the addresses corresponding to the respective word lines have the above-described relation, the address generator 1310 may generate a value obtained by adding or subtracting a preset value to or from the input value STO_ADD. In this case, when the first target active signal TAR_ACT1 is activated, the address generator 1310 may generate a value obtained by adding or subtracting 1 to or from the input value, and when the second target active signal TAR_ACT2 is activated, the address generator 1310 may generate a value obtained by adding or subtracting 2 to or from the input value.

In the case of (1), the value obtained by subtracting 1 from the input value STO_ADD is the target address TAR_ADD corresponding to WLK−1, and the value obtained by adding 1 to the input value STO_ADD is the target address TAR_ADD corresponding to WLK+1. In the case of (2), the value obtained by adding 1 to the input value STO_ADD is the target address TAR_ADD corresponding to WLK−1, and the value obtained by subtracting 1 from the input value STO_ADD is the target address TAR_ADD corresponding to WLK+1. Furthermore, in the case of (1), the value obtained by subtracting 2 from the input value STO_ADD is the target address TAR_ADD corresponding to WLK−2, and the value obtained by adding 2 to the input value STO_ADD is the target address TAR_ADD corresponding to the WLK+2. In the case of (2) the value obtained by adding 2 to the input value STO_ADD is the target address TAR_ADD corresponding to WLK−2, and the value obtained by subtracting 2 from the input value STO_ADD is the target address TAR_ADD corresponding to the WLK+2.

In accordance with embodiments according to the present invention, since an additional refresh operation is periodically performed on memory cells in which data may be degraded due to word line disturbance, the memory and the memory system may operate normally.

The first time point is included in a time section other than the refresh section. The first time point may be a 'random time point' that is decided randomly regardless of the influence of other elements of the memory, or it may be a 'preset/set time point that satisfies a preset/set condition.

While this specification contains many exemplary embodiments according to the present invention, these should not be construed as limitations on the scope of any invention or of what may be claimed, but rather as descriptions of features that may be specific to particular embodiments of particular inventions. Certain features that are described in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, any separation of various system components in the embodiments described herein, should not be understood as requiring such separation in all embodiments.

In the drawings and specification, there have been disclosed typical exemplary embodiments of the invention, and although specific terms are employed, they are used in a generic and descriptive sense only and not for purposes of limitation. As for the scope of the invention, it is set forth in the following claims. Therefore, it will be understood by those of ordinary skill in the art that various changes in form and details may be made therein without departing from the spirit and scope of the present invention as defined by the following claims.

What is claimed is:

1. A memory comprising:
a plurality of word lines each coupled to one or more memory cells;
an address storage unit suitable for storing an address of a word line selected for access by a control unit among the plurality of word lines at a first time point; and
the control unit suitable for sequentially refreshing the plurality of word lines in response to application of a refresh command, refreshing one or more adjacent word lines adjacent to a word line corresponding to the address stored in the address storage unit in response to every Nth application of the refresh command where N is a natural number and selecting one or more of the plurality of word lines for access,
wherein the first time point is included in time section other than a refresh section in which the control unit refreshes one or more word lines in response to application of the refresh command,
wherein the address storage unit stores the address of the selected word line among the plurality of word lines in response to every Mth application of an active command where M is a natural number.

2. The memory of claim 1, wherein the address storage unit periodically stores the address of the selected word line among the plurality of word lines within a preset period.

3. The memory of claim 1, wherein the address storage unit stores the address of the selected word line among the plurality of word lines at a preset time after every Qth application of the refresh command where Q is a natural number.

4. The memory of claim 1, wherein the address storage unit stores the address of the selected word line among the plurality of word lines in response to Mth application of an active command after Qth application of the refresh command where M and Q are natural numbers.

5. The memory of claim 1, wherein the control unit activates a word line corresponding to an input address in response to application of an active command, a word line corresponding to a counting address in response to application of the refresh command and the one or more adjacent word lines in response to every Nth application of the refresh command is N times, and
wherein the counting address changes whenever the refresh command is applied.

6. The memory of claim 1, wherein the control unit comprises:
a refresh con unit suitable for activating a refresh active signal one or more times in response to application of the refresh command and a target active signal in response to every Nth application of the refresh command; and
a word line control unit suitable for activating a word line corresponding to an input address in response to application of an active command, a word line corresponding to a counting address in response to activation of the refresh active signal and the one or more adjacent word lines in response to activation of the target active signal and the refresh active signal.

7. The memory of claim 6, herein the address storage unit outputs the stored address in response to activation of the target active signal.

8. A memory comprising:
a plurality of word lines each coupled to one or more memory cells;
an address input unit suitable for receiving an address from outside;
an address counting unit suitable for performing a counting operation when a refresh command is applied and generating a counting address using the counting result;
an address storage unit suitable for storing an address of a word line selected for activation by a control unit among the plurality of word lines at a first time point; and
the control unit suitable for activating a word line corresponding to the address received by the address input unit in response to application of an active command and refreshing a word line corresponding to the counting address in response to application of the refresh command and one or more adjacent word lines adjacent to a word line corresponding to the address stored in the address storage unit in response to every Nth application of the refresh command where N is a natural number,
wherein the first time point is included in time section other than refresh section in which the control unit refreshes one or more word lines in response to application of the refresh command,
wherein the address storage unit stores the address of the selected word line among the plurality of word lines in response to every Mth application of an active command where M is a natural number.

9. The memory of claim 8, wherein the address storage unit periodically stores the address of the selected word line among the plurality of word lines within a preset period.

10. The memory of claim 8, wherein the address storage unit outputs the stored address in response to every Nth application of the refresh command.

11. A memory system comprising:
a memory having a plurality of word lines each coupled to one or more memory cells and suitable for sequentially refreshing the plurality of word lines in response to application of a refresh command, selecting one or more of the plurality of word lines for access, storing an address of the selected word line among the plurality of word lines at a first time point, and refreshing one or more adjacent word lines adjacent to a word line corresponding to the stored address in response to every Nth application of the refresh command; and
a memory controller suitable for periodically applying the refresh command to the memory, wherein the first time point is included in time section other than refresh section in which one or more word lines are refreshed in response to application of the refresh command,
wherein the memory stores the address of the selected word line among the plurality of word lines in response to every Mth application of an active command where M is a natural number.

12. The memory system of claim 11, wherein the memory periodically stores the address of the selected word line among the plurality of word lines within a preset period.

13. The memory system of claim 11, wherein the memory controller applies one or more signals of an access command, an input address and data to the memory during an access operation and
the first time point is included in an access section in which the memory performs the access operation.

14. The memory system of claim 13, wherein the access operation comprises one or more operations of activating the selected word line among the plurality of word lines, writing data to one or more memory cells coupled to the selected word line among the plurality of word lines and reading data of the one or more memory cells coupled to the selected word line among the plurality of word lines.

15. The memory system of claim 13, wherein the memory selects a word line corresponding to the input address during the access period and refreshes a word line corresponding to a counting address in response to application of the refresh command and the one or more adjacent word lines in response to every Nth application of the refresh command, and
  wherein the counting address changes whenever the refresh command is applied.

16. A memory comprising:
  a plurality of cell arrays each having a plurality of word lines coupled to one or more memory cells;
  an address storage unit suitable for storing an address of a word line selected for access by each of a plurality of word line control units among the plurality of word lines in each of the cell arrays at a first time point;
  a refresh control unit suitable for activating a plurality of refresh active signals one or more times in response to application of a refresh command and a target active signal in response to every Nth application of the refresh command where N is a natural number; and
  the plurality of word line control units each suitable for sequentially refreshing the plurality of word lines of a corresponding cell array in response to application of a corresponding refresh active signal among the plurality of refresh active signals, refreshing one or more adjacent word lines adjacent to a word line corresponding to the address stored in the address storage unit in the corresponding cell array in response to every Nth application of the corresponding refresh active signal among the plurality of refresh active signals when the target active signal is activated, and selecting one or more of the plurality of word lines for access,
  wherein the time point is included in time section other than refresh section in which the plurality of word line control units refresh one or more word lines in response to application of the refresh command
  wherein the address storage unit stores the address of the selected word line among the plurality of word lines in response to every Mth application of an active command where M is a natural number.

17. The memory of claim 16, wherein the address storage unit periodically stores the address of the selected word line among the plurality of word lines in each of the cell arrays within a preset period.

18. The memory of claim 16, wherein each of the word line control units activates a word line corresponding to an input address in response to application of an active command and selection of the corresponding cell array, refreshes a word line corresponding to a counting address in response to application of the refresh command and activates and precharges the one or more adjacent word lines in response to every Nth application of the refresh command, and
  wherein the counting address changes whenever the refresh command is applied.

19. The memory of claim 16, wherein the address storage unit sequentially outputs addresses corresponding to the plurality of cell arrays in response to every Nth application of the refresh command.

20. The memory of claim 16, wherein the plurality of word line control units sequentially activate a plurality of refresh signals whenever the refresh command is applied.

21. A memory comprising:
  a plurality of word lines each coupled to one or more memory cells;
  an address storage unit suitable for storing an address; and
  a control unit suitable for sequentially refreshing the plurality of word lines in response to application of a refresh command which is periodically applied, refreshing one or more first adjacent word lines adjacent to a word line corresponding to the address stored in the address storage unit in response to every Nth application of the refresh command, and refreshing one or more second adjacent word lines adjacent to the first adjacent word line in response to every Mth application of the refresh command, where M≥N.

22. The memory of claim 21, wherein when the plurality of word lines are sequentially arranged and the word line corresponding to the address stored in the address storage unit is a Kth word line among the plurality of word lines,
  the one or more first adjacent word lines include one or more word lines of a (K−1)th word line and a (K+1)th word line, and
  the one or more second adjacent word lines include one or more word lines of a (K−2)th word line and a (K+1)th word line.

23. The memory of claim 21, further comprising an address counting unit suitable for performing a counting operation when a refresh command is applied, and generating a counting address using the counting result.

24. The memory of claim 23, wherein the control unit comprises:
  a refresh control unit suitable for activating a refresh active signal one or more times in response to application of the refresh command, activating a first target active signal in response to every Nth application of the refresh command, and activating a second target active signal in response to every Mth application of the refresh command; and
  a word line control unit suitable for activating a word line corresponding to an input address in response to application of an active command, activating a word line corresponding to the counting address in response to application of the refresh active signal, activating the one or more first adjacent word lines in response to application of the refresh active signal in case where the first target active signal is activated, and activating the one or more second adjacent word lines in response to application of the refresh active signal in case where the second target active signal is activated.

25. The memory of claim 24, wherein the word lane control unit comprises:
  an address generator suitable for receiving the address stored in the address storage unit, and generating a target address corresponding to the one or more first adjacent word lines in response to activation of the first target active signal, or generating a target address corresponding to the one or more second adjacent word lines in response to activation of the second target active signal;
  an address transmitter suitable for transmitting the input address as the address signal when the active command is activated, transmitting the counting address as an address signal when the refresh active signal is activated, and transmitting the target address as the address signal when one or more signals of the first and second target active signals are activated; and
  a word line controller suitable for activating a word line corresponding to the address signal when the active command or the refresh active signal is activated.

26. The memory of claim 25, wherein an address corresponding to each of the (K−1)th word line and the (K+1)th word line has a value obtained by adding or subtracting 1 to or from the value of the address corresponding to the Kth word line, and an address corresponding to each of the (K−2)th word line and the (K+2)th word line has a value obtained by adding or subtracting 2 to or from the value of the address corresponding to the Kth word line.

27. The memory of claim 26, wherein the address generator generates a value obtained by adding or subtracting a preset value to or from the input value, and when the first target active signal is activated, the address generator generates a value obtained by adding or subtracting 1 to or from the input value, and when the second target active signal is activated, the address generator generates a value obtained by adding or subtracting 2 to or from the input value.

28. The memory of claim 21, wherein the address storage unit stores the address of a word line of which the active count is equal to or more than a preset count among the plurality of word lines, or stores the address of a word line of which the active frequency is equal to or more than a preset frequency among the plurality of word lines.

29. The memory of claim 21, wherein the address storage unit stores the address of a word line selected at a preset time between two adjacent refresh sections.

\* \* \* \* \*